US012412602B2

(12) United States Patent
Jo

(10) Patent No.: US 12,412,602 B2
(45) Date of Patent: Sep. 9, 2025

(54) LOW-POWER MEMORY SYSTEM AND MEMORY CONTROLLER WITH COMPATIBILITY AND AN OPERATION METHOD THEREOF

(71) Applicant: SK hynix Inc., Gyeonggi-do (KR)

(72) Inventor: Myung Jin Jo, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 189 days.

(21) Appl. No.: 18/461,504

(22) Filed: Sep. 6, 2023

(65) Prior Publication Data

US 2024/0331744 A1 Oct. 3, 2024

(30) Foreign Application Priority Data

Mar. 29, 2023 (KR) .................. 10-2023-0041045

(51) Int. Cl.
*G11C 7/10* (2006.01)
*G11C 7/22* (2006.01)

(52) U.S. Cl.
CPC .......... *G11C 7/1069* (2013.01); *G11C 7/1063* (2013.01); *G11C 7/222* (2013.01)

(58) Field of Classification Search
CPC ..... G11C 7/1069; G11C 7/1063; G11C 7/222; G06F 13/1668; G06F 9/545; G06F 3/0604; G06F 3/0614; G06F 3/0658; G06F 3/0659; G06F 2212/1016; G06F 2212/1032

USPC .................................... 365/189.011
See application file for complete search history.

(56) References Cited

U.S. PATENT DOCUMENTS

| | | | |
|---|---|---|---|
| 8,539,153 B2 * | 9/2013 | Cho | G06F 12/0802 |
| | | | 711/170 |
| 9,158,328 B2 * | 10/2015 | Park | G11C 7/1087 |
| 10,026,142 B2 | 7/2018 | Nalluri et al. | |
| 11,211,141 B2 | 12/2021 | Helmick et al. | |
| 2017/0358327 A1 * | 12/2017 | Oh | G11C 5/02 |
| 2024/0176543 A1 * | 5/2024 | Kim | G06F 3/0611 |

* cited by examiner

*Primary Examiner* — Huan Hoang
(74) *Attorney, Agent, or Firm* — IP & T GROUP LLP

(57) ABSTRACT

A memory system includes at least one memory chip including first information regarding internal configurations and operational characteristics, and a memory controller configured to perform a data input/output operation on the at least one memory chip. The memory controller includes a core-processor engaged with firmware configured to generate at least one first command for controlling an operation associated with the first information, a memory control sequence generator configured to generate at least one second command for controlling an operation performed on a memory chip which includes second information, and a core interface configured to, when the first information is included in the second information, handover, to the core-processor from the memory control sequence generator, a process for generating some of the at least one command associated with a part of the first information, the part not included in the second information.

20 Claims, 10 Drawing Sheets

LOW-POWER MEMORY SYSTEM AND MEMORY CONTROLLER WITH COMPATIBILITY AND AN OPERATION METHOD THEREOF

CROSS-REFERENCE TO RELATED APPLICATIONS

This patent application claims the benefit of priority under 35 U.S.C. § 119(a) to Korean Patent Application No. 10-2023-0041045, filed on Mar. 29, 2023, the entire disclosure of which is incorporated herein by reference.

TECHNICAL FIELD

One or more embodiments of the present disclosure described herein relate to a memory system, and more particularly, to a memory controller with compatibility for various memory devices in a low-power environment, a memory system including the memory controller, and an operation method of the memory system.

BACKGROUND

A memory device or a memory system is typically used as an internal circuit, a semiconductor circuit, an integrated circuit, and/or a removable device in a computing system or an electronic apparatus. There are various types of memory, including a volatile memory and a non-volatile memory. The volatile memory may require power to maintain data. The volatile memory may include a random access memory (RAM), a dynamic random access memory (DRAM), a static random access memory (SRAM), a synchronous dynamic random access memory (SDRAM), and the like. The non-volatile memory can maintain data stored therein when power is not supplied. The non-volatile memory may include a NAND flash memory, a NOR flash memory, a Phase Change Random Access Memory (PCRAM), a Resistant Random Access Memory (RRAM), a Magnetic Random Access Memory (MRAM), etc. Improving the memory device or the memory system can include integrated control of different types of memory, reduced power consumption, increased reliability of data retention, protection from potential modifications to data values due to interruption in energy supply, and/or reduced manufacturing costs.

BRIEF DESCRIPTION OF THE DRAWINGS

The description herein makes reference to the accompanying drawings wherein like reference numerals refer to like parts throughout the figures.

DETAILED DESCRIPTION

Figure 1:
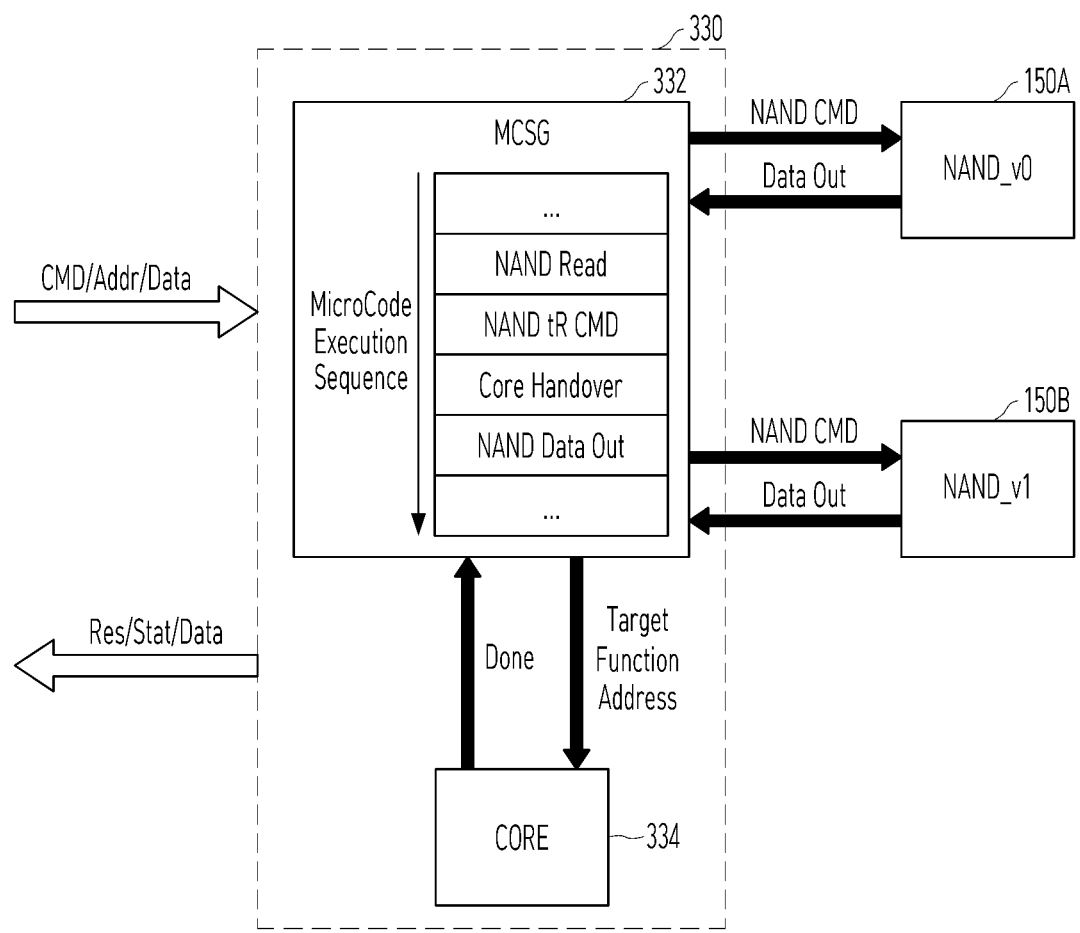
FIG. 1 illustrates a memory controller according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components e.g., an interface unit, circuitry, etc.

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational, e.g., is not turned on nor activated. Examples of block/unit/circuit/component used with the "configured to" language include hardware, circuits, memory storing program instructions executable to implement the operation, etc. Additionally, "configured to" can include a generic structure, e.g., generic circuitry, that is manipulated by software and/or firmware, e.g., an FPGA or a general-purpose processor executing software to operate in manner that is capable of performing the task(s) at issue. "Configured to" may also include adapting a manufacturing process, e.g., a semiconductor fabrication facility, to fabricate devices, e.g., integrated circuits that are adapted to implement or perform one or more tasks.

As used in this disclosure, the term 'machine,' 'circuitry' or 'logic' refers to all of the following: (a) hardware-only circuit implementations such as implementations in only analog and/or digital circuitry and (b) combinations of circuits and software and/or firmware, such as (as applicable): (i) to a combination of processor(s) or (ii) to portions of processor(s)/software including digital signal processor(s), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'machine,' 'circuitry' or 'logic' applies to all uses of this term in this application, including in any claims. As a further example, as used in this application, the term 'machine,' 'circuitry' or 'logic' also covers an implementation of merely a processor or multiple processors or portion of a processor and its (or their) accompanying software and/or firmware. The term 'machine,' 'circuitry' or 'logic' also covers, for example, and if applicable to a particular claim element, an integrated circuit for a storage device.

As used herein, the terms 'first,' 'second,' 'third,' and so on are used as labels for nouns that they precede, and do not imply any type of ordering, e.g., spatial, temporal, logical, etc. The terms 'first' and 'second' do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term 'based on' is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

An embodiment of the present invention can provide a memory system that can control data input/output operations for different memory devices by using a dedicated controller to improve data input/output performance as well as improving compatibility through a low-power core processor engaged with the dedicated controller.

According to an embodiment of the present invention, a memory control sequence generator included in a memory controller can include a process to hand over the generation of instructions corresponding to an internal configuration or operational characteristics of memory devices coupled to the memory controller, so as to optimize data input/output operations with the memory device through a low power core processor even though the memory controller is coupled to an unexpected memory device.

According to an embodiment of the present invention, a memory control sequence generator can be engaged with a low-power core processor and firmware that improve compatibility within a memory controller connected to plural memory devices having different internal configurations and operational characteristics, so as to provide a device and method for performing high-speed hardware-based data input/output operations in a low-power environment.

In an embodiment of the present invention, a memory system can include at least one memory chip including first information regarding internal configurations and operational characteristics; and a memory controller configured to perform a data input/output operation on the at least one memory chip. The memory controller can include a core-processor engaged with firmware configured to generate at least one first command for controlling an operation associated with the first information; a memory control sequence generator configured to generate at least one second command for controlling an operation performed on a memory chip which includes second information; and a core interface configured to, when the first information is included in the second information, handover, to the core-processor from the memory control sequence generator, a process for generating some of the at least one command associated with a part of the first information, the part not included in the second information.

The at least one first command can include a command for checking an operational state of the at least one memory chip.

After the memory control sequence generator transfers a program command for a program operation performed on the at least one memory chip, the core interface can request generation of the some of the at least one first command to the core-processor.

The memory controller can transfer the some of the at least one first command generated by the core-processor to the at least one memory chip through the memory control sequence generator.

After the memory control sequence generator receives a response regarding the some of the at least one first command from the at least one memory chip, the core interface can transfer the response to the core-processor, and the core-processor can analyze the response to check whether the program operation is successfully completed.

The memory control sequence generator can sequentially transfer, to the at least one memory chip, a read command for a read operation performed on the at least one memory chip and the some of the at least one first command.

The core interface can request generation of the some of the at least one first command to the core-processor, before the memory control sequence generator transfers the read command to the at least one memory chip.

The memory control sequence generator can be configured to, based on a response regarding the some of the at least one first command, transfer, to the at least one memory chip, a command for outputting read data subject to the read operation and receive the read data from the at least one memory chip.

The memory controller can further include plural queues configured to be accessed by the core-processor and the core-interface.

The core-processor can include a clock gating circuit configured to activate or deactivate a clock signal based on a request input from the core-interface.

In another embodiment, a method for operating a memory system can include receiving first information regarding an internal structure or operational characteristics from at least one memory chip; comparing the first information with second information regarding a memory chip associated with a command generated by a memory control sequence generator; generating a second command to control an operation associated with an item of the first information, which is included in the second information, by the memory control sequence generator; generating a first command to control an operation associated with another item of the first information, which is not included in the second information, by a core-processor engaged with firmware, the core-processor working with the memory control sequence generator; and transferring the first command and the second command to the at least one memory chip in a preset sequence.

The first command can include a command for checking an operational state of the at least one memory chip.

For a program operation performed on the at least one memory chip, the first command can be generated after a program command included in the second command is transferred to the at least one memory chip.

The method can further include receiving a response subject to the first command from the at least one memory chip; transferring the response to the core-processor; and analyzing the response through the core-processor to determine whether the program operation is successfully completed.

The method can further include sequentially transferring, to the at least one memory chip, a read command for a read operation performed on the at least one memory chip and the first command, to perform the read operation performed on the at least one memory chip.

The method can further include requesting generation of the first command before transferring the read command to the at least one memory chip.

The method can further include receiving a response regarding the first command from at least one memory chip; transferring, to the at least one memory chip, based on the response, a command for outputting read data subject to the read operation; and receiving the read data from the at least one memory chip.

The method can further include activating a clock signal input to the core-processor engaged with the memory control sequence controller, before generating the first command.

In another embodiment, a memory controller can include a core-processor engaged with firmware configured to generate at least one first command for controlling an operation associated with the first information regarding internal configurations and operational characteristics of at least one memory chip; a memory control sequence generator configured to generate at least one second command for controlling an operation performed on a memory chip which includes second information; and a core interface configured to, when the first information is included in the second information, handover, to the core-processor from the memory control sequence generator, a process for generating some of the at least one command associated with a part of the first information, the part not included in the second information.

The first command can include a command for checking an operational state of the at least one memory chip, and the second command can include a program command, a read command, and/or an erase command.

Embodiments will now be described with reference to the accompanying drawings, wherein like numbers reference like elements.

FIG. 1 illustrates a memory controller 330 according to an embodiment of the present disclosure.

Referring to FIG. 1, the memory controller 330 is coupled to first and second memory devices 150A, 150B in order to perform data communication (NAND CMD, Data Out) with the first and second memory devices 150A, 150B. The memory controller 330 may receive a command (CMD), an address (Addr), data (Data), etc. from an external device, and transmit a response (Res), status information (Stat), data (Data), etc. to the external device. In an embodiment, the external device may include a computing device for storing data in the first and second memory devices 150A, 150B or reading data stored in the first and second memory devices 150A, 150B. For example, the external device may include a host 102 described in FIG. 6 or FIG. 7.

The first and second memory devices 150A, 150B connected to the memory controller 330 may include a memory chip including a plurality of volatile memory cells or a plurality of non-volatile memory cells. The first memory device 150A and the second memory device 150B, which are coupled to the memory controller 330, may have different internal configurations and operational characteristics. Compared to the first memory device 150A, the second memory device 150B may include an additional component which is not included in the first memory device 150A but used to improve a data input/output operation. For example, the first memory device 150A may store 3-bit data in one memory cell, whereas the second memory device 150B may store 4-bit data in one memory cell. In another example, the first memory device 150A has an internal structure capable of supporting die interleaving, whereas the second memory device 150B has an internal cache, a state register, etc. for supporting plane interleaving. The foregoing examples are only to describe the difference in internal configuration or operational characteristics of the first memory device 150A and the second memory device 150B. The first memory device 150A and the second memory device 150B can have various differences in internal configurations/structures or operational characteristics, according to an embodiment.

In an embodiment, the second memory device 150B can be more complicated, more diverse than the first memory device 150A, or process a larger amount of data faster than the first memory device 150A. Compared to the first memory device 150A, the second memory device 150B may be developed, designed, or manufactured later. The second memory device 150B may include an internal configuration or operational characteristics not included in the first memory device 150A.

Based on first information regarding internal configuration and operational characteristics of the first memory device 150A and second information regarding internal configuration and operational characteristics of the second memory device 150B, the memory controller 330 can recognize the internal configurations and operational characteristics of the first and second memory devices 150A, 150B which are coupled.

According to an embodiment, a plurality of first memory devices may be coupled to the memory controller 330. The memory controller 330 may include a hardware component optimized to control a data input/output operation performed on the plurality of first memory devices. An example of such hardware component is a memory control sequence generator (MCSG) 332 included in the memory controller 330. The memory control sequence generator 332 may include a device that generates a control signal or a command for accessing the first memory device 150A or manipulating data obtained from, or stored in, the first memory device 150A. For instance, the memory control sequence generator 332 may include a finite state machine or a circuit module which is configured to generate a sequence of control signals or commands based on a set of input signals and a set of preset rules or algorithms. The hardware-based memory control sequence generator 332 may generate control signals or commands used to control access to the first memory device 150A, so as to enable a fast and reliable operation for data processing, data manipulation, and data storage.

The memory control sequence generator 332 can be implemented to ensure that data is properly read from, or written in, the first memory device 150A. This implementation includes generating a signal to activate a specific memory module or a specific memory chip in the first memory device 150A, selecting an appropriate address or a data line, and verifying that synchronization signals are transmitted to the first memory device 150A at a correct or allowable timing. In addition, the memory control sequence generator 332 may perform memory management tasks such as allocating an available memory space for storing new data, releasing an allocated memory space that is no longer needed, and checking error or defect of a memory space in the first memory device 150A. To generate at least one appropriate control signal, the memory control sequence generator 332 could be designed considering various factors such as a type of the first memory device 150A, an access pattern of application or system, a bandwidth requirement of a memory system, and any performance constraints or limitations.

For example, the memory control sequence generator 332 is designed based on the first information on the internal configuration or operational characteristics of the first memory device 150A. However, the memory system can include the second memory device 150B having better data input/output performance than the first memory device 150A to provide better performance of the memory system. In this case, the memory control sequence generator 332 should recognize and consider various factors such as the type of the second memory device 150B, an access pattern of application or system, a bandwidth requirement of the memory system, and any performance constraints or limitations. Accordingly, the memory control sequence generator 332 would be re-designed. However, this method may require designing and producing a memory control sequence generator, exclusively used for each of various types of memory devices which is inefficient, delays development and production of the memory system, and increases a manufacturing cost of the memory system, thereby deteriorating marketability of the memory system.

When the memory control sequence generator 332, designed to generate at least one signal or command based on the first information regarding the internal configuration or operational characteristics of the first memory device 150A, is coupled to the second memory device 150B, the memory controller 330 might not fully use the internal configurations or operational characteristics of the second memory device 150B to provide better performance. Accordingly, the memory controller 330 may further include a core-processor 334 engaging with the memory control sequence generator 332.

The core-processor 334 in the memory controller 330 may include a processing unit that generally performs a specific function associated with access or management of a flash memory system. For example, the memory controller 330 may include a plurality of core-processors. Each of the plurality of core-processors 334 may be implemented as a specialized hardware component optimized for a specific task such as data transfer, error correction, or wear leveling. For example, a data transfer core-processor can manage data transfer between a host system and a flash memory, and handle tasks such as data caching, input/output data buffering, and data flow management with the flash memory chip. An error correction core-processor is a component for detecting and correcting an error in data read from the flash memory, which is called circuitry using an Error Correction Code (ECC) or Cyclic Redundancy Check to ensure data integrity and prevent data loss. In addition, a wear leveling core-processor can manage wear of the first memory device 150A or the second memory device 150B by evenly distributing data writing or programming to an available or usable storage space therein, so that lifespans of the first memory device 150A or the second memory device 150B may become longer. A power management core-processor is a component for managing power consumption of the memory controller 330, the first memory device 150A, or the second memory device 150B, which optimizes power use and extends battery life. For this purpose, techniques such as power gating, clock gating or dynamic voltage scaling could be used. The memory controller 330 may support stable and efficient operation through plural core-processors. As described above, the memory controller 330 may achieve high performance, low power consumption, and high stability by implementing hardware components specialized for specific tasks performed in the memory system.

The core-processor 334 described in FIG. 1 may be designed to generate a command for utilizing the second information regarding the internal configuration or operational characteristics of the second memory device 150B, and to analyze and process a response corresponding to the generated command. Because the memory control sequence generator 332 is designed based on the first information regarding the internal configuration or operation characteristics of the first memory device 150A, the memory control sequence generator 332 can be utilized for an overlapping portion between the second information and the first information. The memory control sequence generator 332 may generate commands and analyze responses associated with some information items of the second information which is included in the first information. However, because other information items of the second information not included in the first information (e.g., some of the second information) were not considered in a design or manufacturing process of the memory control sequence generator 332, the core-processor 334 and firmware operating the core-processor 334 can be used to generate a command regarding the other information items of the second information, which are not included in the first information, and analyze or process a response corresponding to the command. When the memory control sequence generator 332 transfers a specific function (or a target function address) to the core-processor 334, the core processor 334 with the firmware can generate a signal or a command corresponding to an operation associated with the specific function (or the target function address) and transfer the signal or the command to the memory control sequence generator 332 (Done). Detailed configurations and operations of the memory control sequence generator 332 and the core-processor 334 in the memory controller 330 will be described with reference to FIGS. 2 to 5. Also, referring to FIGS. 6 and 7, a data processing system 100 and a memory system 110 to which the memory controller 330 including the memory control sequence generator 332 and the core-processor 334 are applied will be described. Hereafter, a read operation and a write operation in the memory system 110 to which the memory controller 330 including the memory control sequence generator 332 and the core-processor 334 is applied will be described with reference to FIGS. 8 and 9. Further, referring to FIG. 10, an operating method of the memory system 110 will be described.

Figure 2:
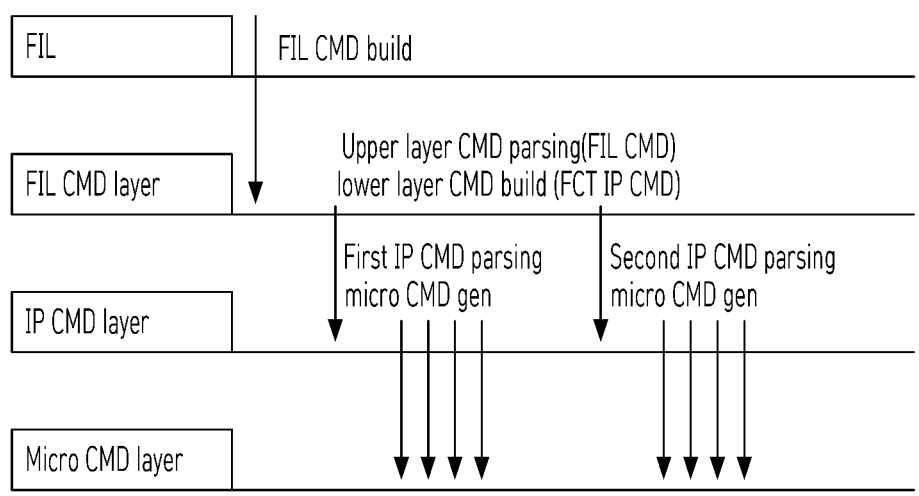
FIG. 2 illustrates a flash interface layer according to an embodiment of the present disclosure.

FIG. 2 illustrates a flash interface layer according to an embodiment of the present disclosure. According to an embodiment, the flash interface layer (FIL) shown in FIG. 2 may correspond to a memory interface (I/F) 142 in FIG. 6 or a flash interface layer (i.e., FIL) 260 in FIG. 7.

The flash interface layer (FIL) may be designed to perform data communication between the memory controller 330 and the first memory device 150A or the second memory device 150B, which are described in FIG. 1. FIG. 2 illustrates the flash interface layer (FIL) divided into a plurality of layers (or sub-layers).

Each layer (or each sub-layer) may include a processor or a logic that analyzes (or parses) a command received from an upper layer and builds (or establishes) a command suitable for a lower layer. A command (FIL CMD) built in the flash interface layer (FIL) can be transferred to the flash interface command layer (FIL CMD layer) which is a lower layer of the flash interface layer (FIL). The flash interface command layer (FIL CMD layer) can analyze the command (FIL CMD) built in the flash interface layer (FIL) (upper layer CMD parsing) and generate one or more flash control transfer commands (FCT IP CMD) which is a type of lower layer commands (lower layer CMD build). When a plurality of flash control transfer commands (first, second FCT IP CMD) generated in the flash interface command layer (FIL CMD layer) are transmitted to an IP command layer (IP CMD layer), the IP command layer (IP CMD layer) can analyze the plurality of flash control transfer commands (first IP CMD parsing, second IP CMD parsing) to generate at least one micro command (i.e., Micro CMD gen). A micro command layer (Micro CMD layer) may transfer the at least one micro command (Micro CMD) from the IP command layer (IP CMD layer) to the first memory device 150A or the second memory device 150B. As commands are transferred from higher layers to lower layers, the number of sub-commands or signals may increase and the complexity of sub-commands may decrease.

According to an embodiment, the flash control transfer command (FCT IP CMD) is a type of command used in a memory system to control an operation performed by an IP core included in a flash interface layer (FIL). Herein, the flash control transfer FCT may include data transfer between another layer and the IP core in the memory system. Flash control transfer commands (FCT IP CMD) are used to control IP core operations, such as reading or writing data, erasing blocks of data, and performing other functions related to manipulating data stored in the memory system. The flash control transfer command (FCT IP CMD) is transmitted to the IP core by the IP command layer (IP CMD layer). The flash control transfer command (FCT IP CMD) can be understood to be an upper-level command rather than the micro command layer, which can be converted to specific commands and signals used by the IP core. Using the Flash control transfer command (FCT IP CMD) may enable efficient and reliable communication between different components in the memory system including at least one memory chip, a controller, buses, and IP cores. A protocol for flash control transfer commands (FCT IP CMD) can use a standardized set of commands or signals to ensure interoperability and compatibility between different components and systems, making it easier to integrate the memory system into a wide range of apparatuses, applications, and devices.

Herein, the IP core refers to a pre-designed and pre-verified unit or block of intellectual property (IP), which could be licensed and integrated into a larger system-on-chip (SoC) design. The IP core can be implemented as reusable hardware components used in a design of complex digital systems such as a microprocessor, a digital signal processor, or another integrated circuit. The IP core can be designed to perform a specific function, such as a memory controller, a graphic processor, digital signal processing (DSP) function circuitry, or a communication interface. Examples of the IP core may include an ARM core used in a mobile device, an Ethernet interface used in a networking equipment, and an USB interface used in a consumer electronic device. When an IP core is embedded in the memory controller 330 to control a data input/output operation for the first memory device 150A or the second memory device 150B, time and cost for developing the memory controller 330 could be reduced, and product reliability and quality could be improved.

According to an embodiment, a micro command is a type of a command of a low level used to control data communication between the memory controller 330 and the first memory device 150A or the second memory device 150B during an operation in the memory system. In some embodiments, a low level may have hardware, mechanical, and physical meanings, while a high level may have software and logical meanings. The micro command may include a binary code transferred between the memory controller 330 and the first memory device 150A or the second memory device 150B through a dedicated interface such as a channel, a data line, or etc. One or more micro commands are used in flash memory systems to perform various functions including reading and writing data, erasing blocks of data, and performing other tasks related to manipulating data stored in the first memory device 150A or the second memory device 150B. The micro command may be executed in a preset manner by the memory controller 330, the first memory device 150A or the second memory device 150B. The micro command protocol uses a standardized set of commands or signals to ensure interoperability and compatibility between different components and systems, enabling the memory system to be more easily integrated into a wide range of apparatuses, applications, and devices.

Referring to FIG. 2, the flash interface layer (FIL), the flash interface command layer (FIL CMD layer), the IP command layer (IP CMD layer), and the micro command layer (Micro CMD layer) configured in the memory controller 330 can be a component involved in managing or controlling an operation on the first memory device 150A or the second memory device 150B. These layers may be designed to operate together to efficiently and reliably store/read data in/from the first memory device 150A or the second memory device 150B.

The flash interface layer (FIL) may serve to perform and control data communication with a physical hardware included in the memory system, including a flash memory chip and a related hardware component such as a controller or a bus. The flash interface layer (FIL) can convert a request transferred from a higher level software component (e.g., the flash translation layer (FTL) 240 in FIG. 7) into specific commands or signals used for the first memory device 150A or the second memory device 150B to read or write data.

The flash interface command layer (FIL CMD layer) can translate low-level commands and requests input from the micro command layer or the IP command layer into specific commands or signals which may be used by the flash interface layer (FIL) to interact with another physical hardware. Further, the flash interface command layer can convert at least one high-level command into at least one low-level command optimized for the physical characteristics of the first memory device 150A or the second memory device 150B and related hardware to minimize data errors and reduce wear of the first memory device 150A or the second memory device 150B, in order to improve overall performance of the memory system. According to an embodiment, the flash interface command layer (FIL CMD layer) may be further configured to perform additional functions (e.g., error detection and correction, data encryption or compression, memory management or optimization).

The IP command layer (IP CMD layer) is a component related to the intellectual property (IP) core-processor that performs a specific function used in the memory system. The IP command layer can translate a request transferred from the flash interface command layer (FIL CMD layer) into specific commands or signals required by the IP core-processor, so that the IP core-processor performs an operation according to the specific commands or signals. The IP command layer can interact with the flash interface command layer (FIL CMD layer) and micro command layer (Micro CMD layer) to allow the IP core-processor to access and manipulate data stored in the first memory device 150A or the second memory device 150B as needed.

The micro command layer (Micro CMD layer) is included in the memory controller 330 coupled to the first memory device 150A or the second memory device 150B. The micro command layer (Micro CMD layer) may be the lowest layer of the memory controller 330, which can control or manage overall operations performed on the first memory device 150A or the second memory device 150B. The micro command layer can interact with the IP command layer to transfer commands or signals transmitted from the IP core-processor to the first memory device 150A or the second memory device 150B, and to deliver data, responses, etc. received from the first memory device 150A or the second memory device 150B to the IP command layer (IP CMD layer).

The flash interface layer (FIL), the flash interface command layer (FIL CMD layer), the IP command layer (IP CMD layer), and the micro command layer (Micro CMD layer) can interwork with each other to control or manage operations performed within the first memory device 150A or the second memory device 150A. For example, the micro command layer (Micro CMD layer) can provide low-level communication with the physical hardware of the memory system, while the flash interface layer (FIL) can control an operation performed in the first memory device 150A or the second memory device 150B. According to an embodiment, a complex or complicated operation performed by the memory controller 330 is divided into plural stages or parts. In another embodiment, the complex or complicated operation can be divided into plural unit operations with reduced complexity, which may be assigned to each of a plurality of sub-layers. Accordingly, the memory controller 330 can improve overall performance. Further, the plural layered configuration described above could ensure that the memory controller 330 efficiently and stably processes plural data input/output operations that are concurrently or parallelly performed in a plurality of memory chips included in the first memory device 150A or the second memory device 150B.

Figure 3:
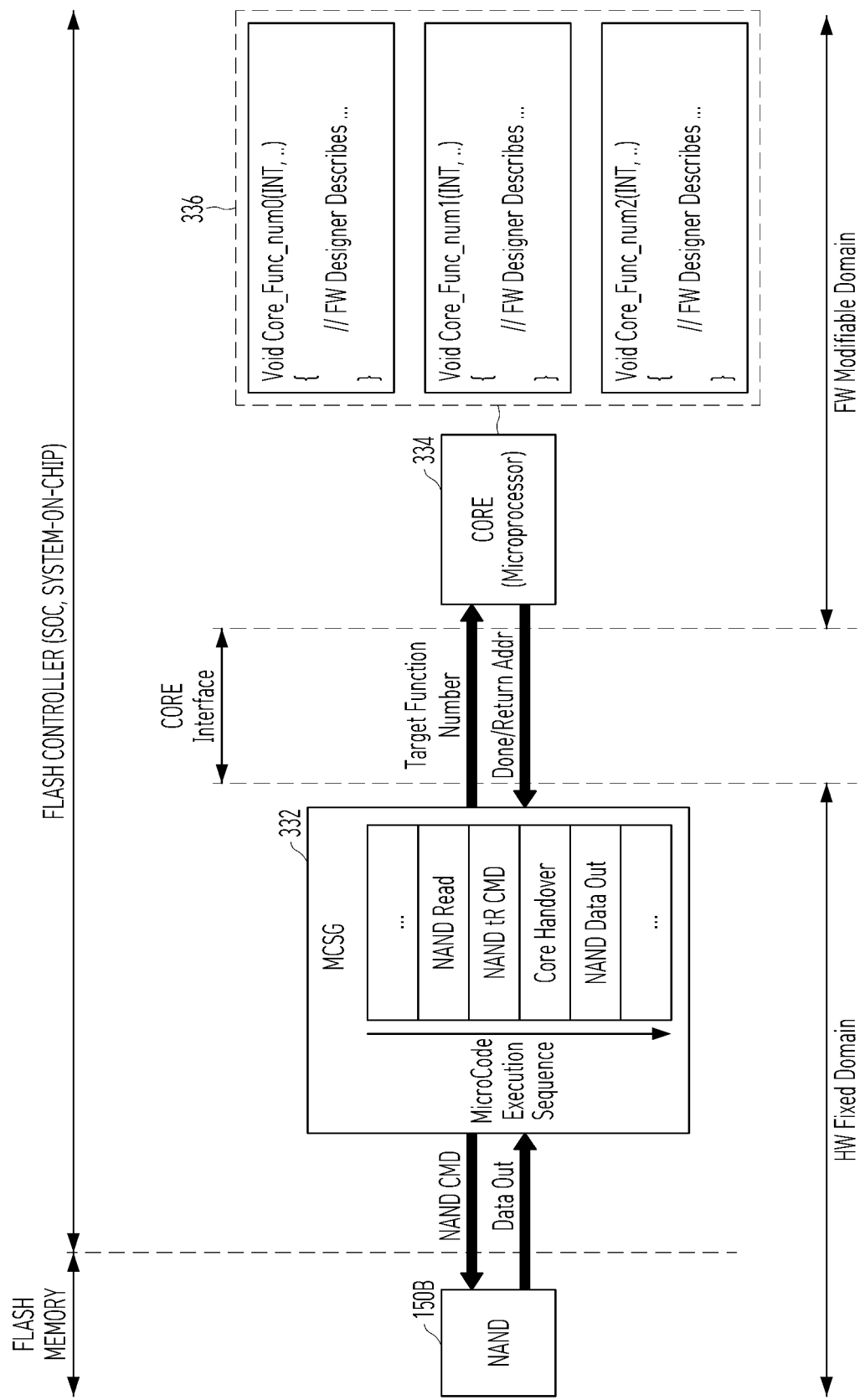
FIG. 3 illustrates a memory system according to an embodiment of the present disclosure.

FIG. 3 illustrates a memory system according to an embodiment of the present disclosure.

Referring to FIG. 3, a memory system may include a memory device (e.g., flash controller) and a memory controller (e.g., flash memory).

According to an embodiment, the memory device may include the second memory device 150B that is a flash memory, and the memory controller may include a flash controller. The flash controller may be implemented as a System-on-Chip (SoC). A SoC is a type of integrated circuit that integrates all components of a computer or another electronic system into a single chip. A memory system can provide an integrated storage solution through a memory controller implemented as a system-on-chip (SoC). A SoC can include several major components including a processor, a memory, an input/output interface, and a controller. In addition, the system on chip (SoC) may include a special-purpose hardware accelerator configured or designed for performing a specific task such as encryption, compression, and deduplication. The SoC can integrate plural components into a single chip to provide higher performance and efficiency, while reducing complexity and cost of the memory system, increasing integration, and operating in a low-power environment.

According to embodiments, the memory system may be divided into two types of a hardware fixed domain (HW Fixed Domain) and a firmware modifiable domain (FW Modifiable Domain) according to a design approach. The hardware fixed domain may refer to a design approach in which functions and operations of the memory system are set, scheduled, controlled, or performed by at least one hardware component. With this design approach, the hardware component might be immutable and therefore could not be modified or updated after the memory system including the hardware component, is manufactured. Examples belonging to the hardware fixed domain can include the second memory device 150B and the memory control sequence generator 332 included in the memory controller 330 of the memory system shown in FIGS. 1 and 3. The firmware modifiable domain may refer to a design approach in which functions and operations of the memory system are defined or scheduled by software (e.g., firmware) that could be updated or modified after the memory system is manufactured. In this design approach, a hardware component could be designed to be flexible and adaptable to changes in the software. For example, a general-purpose core-processor 334 (or a micro-processor) may be driven or operated by the software, instead of a specific purpose designed hard component. The general-purpose core-processor 334 (or a micro-processor) may be driven through firmware 336. The firmware 336 is stored in a non-volatile memory and could be updated by a user or the memory system itself.

Referring to FIGS. 1 to 3, the memory control sequence generator 332 may belong to the hardware fixed domain. The memory control sequence generator 332 is designed to correspond to the first memory device 150A, which is included in the memory controller 330. The second memory device 150B as well as the first memory device 150A may be coupled to the memory controller 330. Because the memory controller 330 could be designed for controlling and managing overall operations of the first and second memory devices 150A, 150B, the memory controller 330 can include a general-purpose core-processor 334 and the firmware 336 which belong to the firmware modifiable domain. In addition, the memory controller 330 may include a core interface configured to interwork the memory control sequence generator 332, the core 334, and the firmware 336 with each other.

The core interface may be used to facilitate communication and coordination between the memory control sequence generator 332 and the core-processor 334. The core interface can be designed so that the memory control sequence generator 332 can send commands or signals to the core-processor 334 or the firmware 336. The core-processor 334 with the firmware 336 can perform an appropriate task or respond to the commands or the signals via transmission of data. The core interface may take various forms based on a configuration or the components of the memory system. According to an embodiment, a messaging system or at least one queue 338 (shown in FIGS. 8 and 9) can be used or included.

According to an embodiment, the core interface can be configured to provide a level of abstraction that allows the core-processor 334 or the firmware 336 to access hardware components without having to deal with low-level details of the memory control sequence generator 332. For example, when the memory control sequence generator 332 may transfer authority to the core-processor 334, the core interface can provide a specific function number (Target Function Number), which is responsive to an operation state in which the authority is transferred, to the core-processor 334 or the firmware 336. The core-processor 334 or the firmware 336 may generate or output a specific command or a specific address (Done/Return Addr) to the memory control sequence generator 332 after performing an operation or a logical calculation associated with the specific command or the specific function number (Target Function Number). The memory control sequence generator 332 may terminate a handover, after receiving the specific command or the specific address (Done/Return Addr) to perform an operation corresponding to the specific command or the specific address input from the core-processor 334.

If the memory control sequence generator 332 is designed to control and manage an operation of the first memory device 150A, it could be difficult that the memory control sequence generator 332 has expandability or compatibility to the second memory device 150B which is later developed than the first memory device 150A because the memory control sequence generator 332 is a type of hardware component which could not be modified or changed after being manufactured. Therefore, when the memory controller 330 including the memory control sequence generator 332 is coupled to the second memory device 150B, improved performance of the second memory device 150B, unlike that of the first memory device 150A, might not be achieved. For example, efficient control and management based on characteristics or internal configurations of the second memory device 150B could be difficult. Referring to FIG. 3, the memory control sequence generator 332 may be designed to hand over authority to the core-processor 334 for a part which could not be solved by itself. In this regard, the configuration of the memory control sequence generator 332 will be described in detail with reference to FIGS. 4 and 5.

Figure 4:
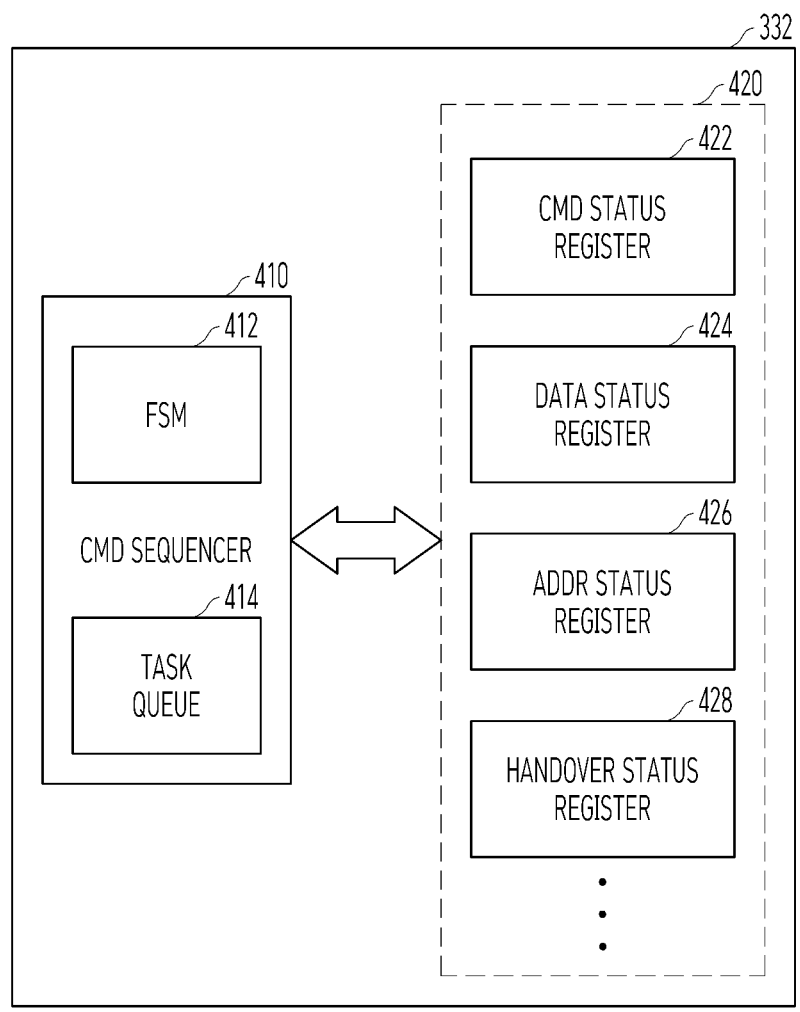
FIG. 4 illustrates a memory control sequence generator according to an embodiment of the present disclosure.

FIG. 4 illustrates a memory control sequence generator 332 according to an embodiment of the present disclosure.

Referring to FIG. 4, the memory control sequence generator 332 may include a command (CMD) sequencer 410 and a plurality of status registers 420. The plurality of status registers 420 may include a command (CMD) status register 422, a data status register 424, an address (ADDR) status register 426, a transfer status register 428, and the like. The command sequencer 410 may include a finite state machine (FSM) 412 and at least one task queue 414.

The plurality of status registers 420 may store commands, data, or information transmitted from the command sequencer 410, which are to be transmitted to the first memory device 150A or the second memory device 150B through the at least one task queue 414. Alternatively, the plurality of status registers 420 can record a state based on a response or data received from the first memory device 150A or the second memory device 150B. For example, detailed tasks such as a read operation, a write operation, and an erase operation, which are data input/output operations performed on the first memory device 150A or the second memory device 150B, can be sequentially performed. The detailed tasks can be determined and performed based on the internal configuration or operating characteristics of the memory device 150A or the second memory device 150B. The progress of the detailed work may be determined according to whether a command is delivered, whether an address is delivered, or whether data is transmitted or received. The plurality of status registers 420 can store states such as commands, addresses, data, status information, and responses transmitted and received between the memory controller 330 and the first memory device 150A or the second memory devices 150B. Based on information stored in the plurality of status registers 420, the command sequencer 410 may proceed or check a preset command sequence or control state transition in the finite state machine 412.

The command sequencer 410 may include a finite state machine (FSM) 412 related to control detailed tasks such as data input/output operations, for example, a read operation, a write operation, and an erase operation. The command sequencer 410 may sequentially generate commands based on the finite state machine 412. The generated commands may be stored in the task queue 414. Values of the plurality of status registers 420 may be updated based on information transmitted and received between the task queue 414 and the first memory device 150A or the second memory device 150B. When at least one value of the plurality of status registers 420 is updated, the command sequencer 410 can make a transition to, or move to, a next step in response to the finite state machine 412. The finite state machine 412 will be described later with reference to FIG. 5.

Figure 5:
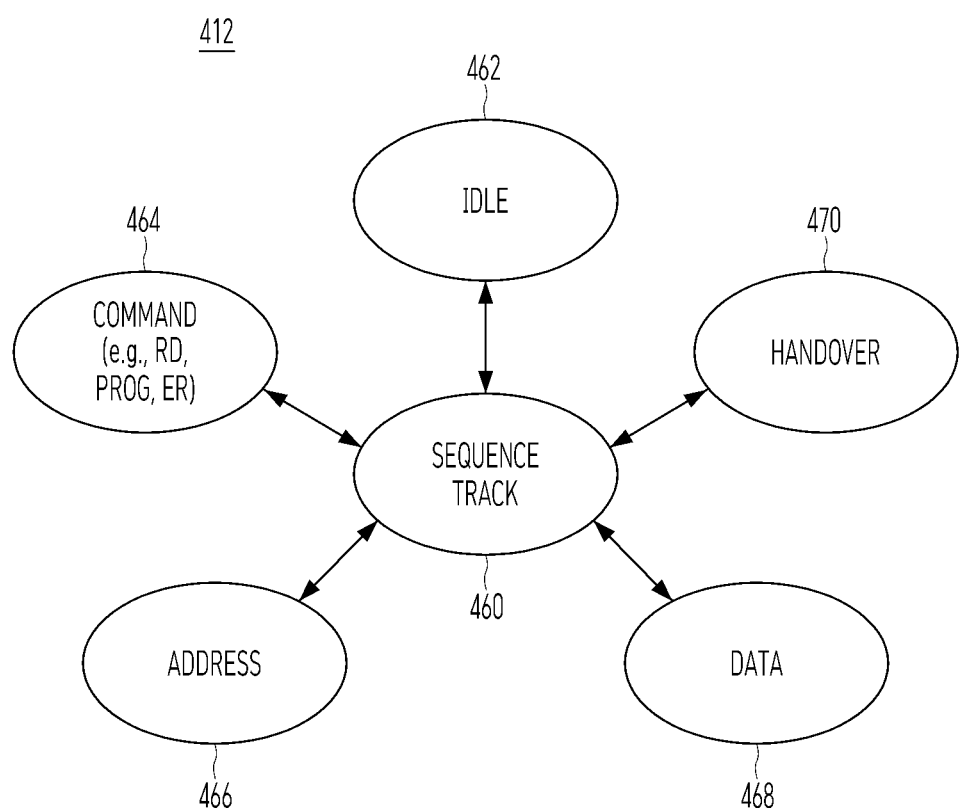
FIG. 5 illustrates a finite state machine included in a memory control sequence generator according to an embodiment of the present disclosure.

FIG. 5 illustrates the finite state machine 412 included in the memory control sequence generator 332 according to an embodiment of the present disclosure.

Referring to FIG. 5, the finite state machine 412 can include a sequence track state 460, an idle state 462, a command state 464, an address state 466, a data state 468, and a handover state 470. Upon detecting a request in the idle state 462, the command sequencer 410 may recognize a type of operation to be performed and load values stored in registers 420 associated with the operation. The values stored in the registers 420 may be used as a factor for determining a current step of an operation sequence that the command sequencer 410 executes. The command sequencer 410 may make a transition from the idle state 462 to the sequence track state 460. In the sequence track state 460, the command sequencer 410 may determine a next state according to the current step of the operation sequence. In the sequence track state 460, the command sequencer 410 can sequentially generate at least one command or signal according to the command sequence. A current state can be transitioned to another state for performing an operation or a task related to a command, address, data, etc. based on the at least one command or signal.

For example, in the command state 464, a command or a signal may be transferred to either the first memory device 150A or the second memory device 150B. When command state 464 is completed or done, the command sequencer 410 can make a transition to the sequence track state 460. Information regarding the command value could be in the command status register 422. In the address state 466, the address may be transmitted to the first memory device 150A or the second memory device 150B. When address transmission is completed or done, the command sequencer 410 can make a transition to the sequence track state 460. In the data state 468, data may be transferred from the memory controller 330 to the first memory device 150A or the second memory device 150B. When data transfer is completed or done, the command sequencer 410 can make a transition to the sequence track state 460. The command sequencer 410 may make a transition to the data state 468 when data is received from the first memory device 150A or the second memory device 150B. After the command sequencer 410 transmits a command, address, or data to the first memory device 150A or the second memory device 150B with a state transition, the command sequencer 410 may release or delete corresponding information. When a command sequence in a specific unit is transmitted to the command sequencer 410, the command sequencer 410 may release or delete information regarding the specific unit in the sequence track state 460 after operations corresponding to the specific unit are done.

According to an embodiment, the command sequencer 410 can transmit a command or a signal to the first memory device 150A or the second memory device 150B, or can receive data or information from the first memory device 150A or the second memory device 150B. Correspondingly, a state transition may be repeatedly performed. Such state transition may be backed up or maintained for a preset period of time or a preset level.

According to an embodiment, the command sequencer 410 may make a state transition to the handover state 470 for a specific command in the operation sequence. The handover state 470 may be determined according to a type of memory device that is coupled to, and communicates with the memory controller 330 including the memory control sequence generator 332. For example, although the memory control sequence generator 332 is designed to generate a command sequence related to data input/output operations performed on the first memory device 150A, the memory control sequence generator 332 might not fully support operations performed on the second memory device 150B because it is not designed for generating a command sequence for at least some components or operational characteristics. Accordingly, when the memory control sequence generator 332 recognizes that the second memory device 150B is coupled to the memory controller 330, the command sequencer 410 can make a transition to the handover state 470 to generate a command or a signal associated with some components or operational characteristics of the second memory device 150B. When the command sequencer 410 enters the handover state 470, a target function number may be transmitted from the core-processor 334 or the firmware 336 through the core interface in FIG. 3. Upon receiving a command, address, or code corresponding to the specific target function number from the core-processor 334 or the firmware 336, the command sequencer 410 can return to the sequence track state 460 to perform the corresponding command, address, or code.

Figure 6:
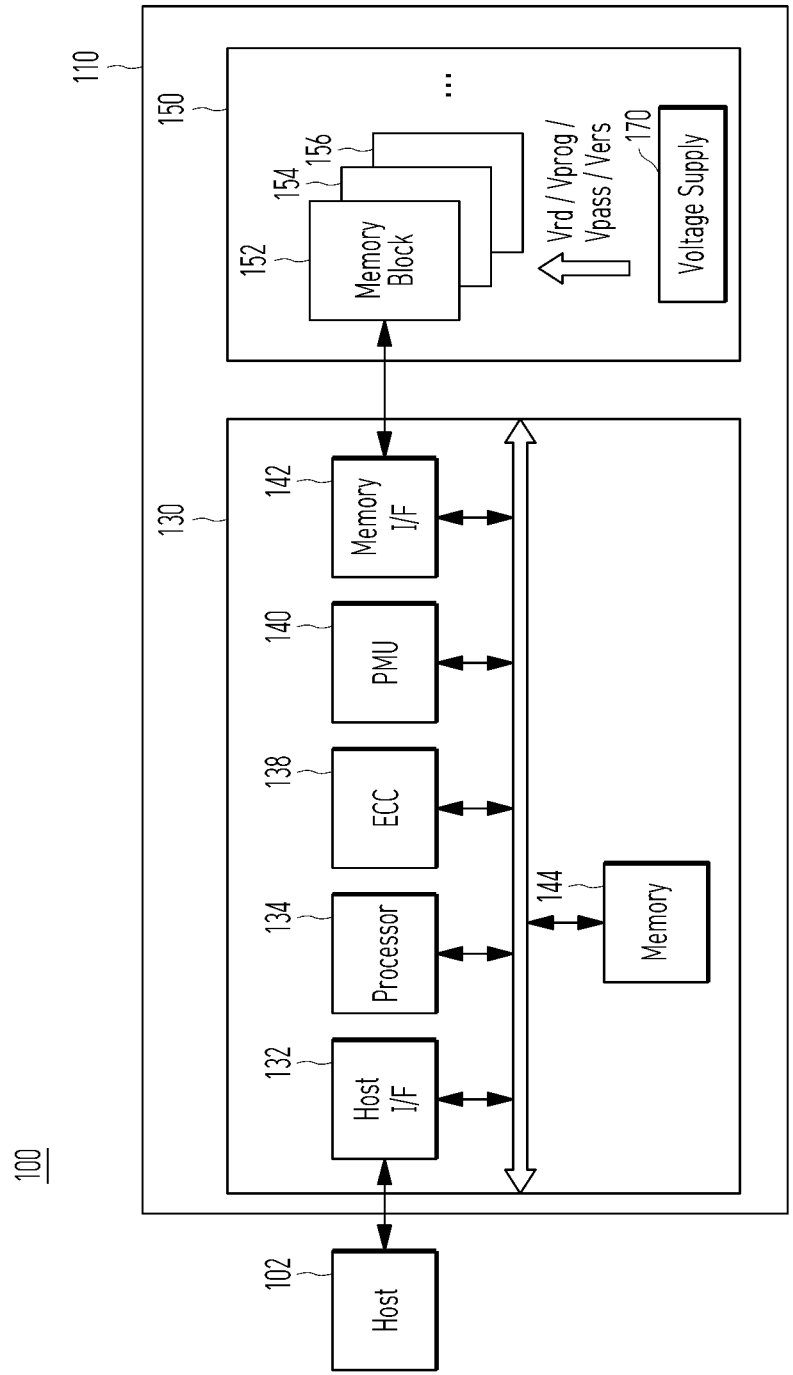
FIG. 6 illustrates a data processing system according to an embodiment of the present disclosure.

FIG. 6 illustrates a data processing system 100 according to an embodiment of the present disclosure.

Referring to FIG. 6, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single chip or a plurality of chips.

The controller 130 may perform a data input/output operation (such as a read operation, a program operation, an erase operation, or etc.) in response to a request or a command input from an external device such as the host 102. For example, when the controller 130 performs a read operation in response to a read request input from an external device, data stored in a plurality of non-volatile memory cells included in the memory device 150 is transferred to the controller 130. Further, the controller 130 can independently perform an operation regardless of the request or the command input from the host 102. Regarding an operation state of the memory device 150, the controller 130 can perform an operation such as garbage collection (GC), wear leveling (WL), a bad block management (BBM) for checking whether a memory block is bad and handling a bad block.

The memory device 150 may include a plurality of memory blocks 152, 154, 156. The memory blocks 152, 154, 156 may be understood as a group of non-volatile memory cells in which data is removed together by a single erase operation. Although not illustrated, the memory block 152, 154, 156 may include a page which is a group of non-volatile memory cells that store data together during a single program operation or output data together during a single read operation. For example, one memory block 152, 154, 156 may include a plurality of pages. The memory device 150 may include a voltage supply circuit 170 capable of supplying at least one voltage into the memory block 152, 154, 156. The voltage supply circuit 170 may supply a read voltage Vrd, a program voltage Vprog, a pass voltage Vpass, or an erase voltage Vers into a non-volatile memory cell included in the memory block 152, 154, 156.

The host 102 interworking with the memory system 110, or the data processing system 110 including the memory system 110 and the host 102, is a mobility electronic device (such as a vehicle), a portable electronic device (such as a mobile phone, an MP3 player, a laptop computer, or the like), and a non-portable electronic device (such as a desktop computer, a game machine, a TV, a projector, or the like). The host 102 may provide interaction between the host 102 and a user using the data processing system 100 or the memory system 110 through at least one operating system (OS). The host 102 transmits a plurality of commands corresponding to a user's request to the memory system 110, and the memory system 110 performs data input/output operations corresponding to the plurality of commands (e.g., operations corresponding to the user's request).

The memory system 110 may be implemented with any of various types of storage devices. Non-limiting examples of storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like. According to an embodiment, the controller 130 may include a host interface (I/F) 132, a processor 134, a power management unit (PMU) 140, a memory interface (I/F) 142, and a memory 144. Components may be added to or omitted from the controller 130 according to structures, functions, operation performance, or the like, regarding the memory system 110.

The host 102 and the memory system 110 each may include a controller or an interface for transmitting and receiving signals, data, and the like, in accordance with one or more predetermined protocols. For example, the host interface 132 in the memory system 110 may include an apparatus or a circuit capable of transmitting signals, data, and the like to the host 102 or receiving signals, data, and the like from the host 102. According to an embodiment, the host interface 132 is a type of layer for exchanging data with the host 102 and is implemented with, or driven by, firmware called a host interface layer (HIL). According to an embodiment, the host interface 132 can include a command queue.

The host 102 and the memory system 110 may use a predetermined set of rules or procedures for data communication or a preset interface to transmit and receive data therebetween. Examples of sets of rules or procedures for data communication standards or interfaces supported by the host 102 and the memory system 110 for sending and receiving data include Universal Serial Bus (USB), Multi-Media Card (MMC), Parallel Advanced Technology Attachment (PATA), Small Computer System Interface (SCSI), Enhanced Small Disk Interface (ESDI), Integrated Drive Electronics (IDE), Peripheral Component Interconnect Express (PCIe or PCI-e), Serial-attached SCSI (SAS), Serial Advanced Technology Attachment (SATA), Mobile Industry Processor Interface (MIPI), and the like. According to an embodiment, the host 102 and the memory system 110 may be coupled to each other through a Universal Serial Bus (USB). The Universal Serial Bus (USB) is a highly scalable, hot-pluggable, plug-and-play serial interface that ensures cost-effective, standard connectivity to peripheral devices such as keyboards, mice, joysticks, printers, scanners, storage devices, modems, video conferencing cameras, and the like.

The memory system 110 may support the Non-volatile memory express (NVMe). The NVMe is a type of interface based at least on a Peripheral Component Interconnect Express (PCIe) designed to increase performance and design flexibility of the host 102, servers, computing devices, and the like equipped with the non-volatile memory system 110. The PCIe can use a slot or a specific cable for connecting a computing device (e.g., host 102) and a peripheral device (e.g., memory system 110). For example, the PCIe can use a plurality of pins (e.g., 18 pins, 32 pins, 49 pins, or 82 pins) and at least one wire (e.g., ×1, ×4, ×8, or ×16) to achieve high speed data communication over several hundred MB per second (e.g., 250 MB/s, 500 MB/s, 984.6250 MB/s, or 1969 MB/s). According to an embodiment, the PCIe scheme may achieve bandwidths of tens to hundreds of Giga bits per second.

The power management unit (PMU) 140 may control electrical power provided to the controller 130. The PMU 140 may monitor the electrical power supplied to the memory system 110, e.g., a voltage supplied to the controller 130, and provide the electrical power to components included in the controller 130. The PMU 140 may not only detect power-on or power-off, but also generate a trigger signal to enable the memory system 110 to urgently back up a current state when the electrical power supplied to the memory system 110 is unstable. According to an embodiment, the PMU 140 may include a device or a component (such as Auxiliary Power Supply) capable of accumulating electrical power that may be used in an emergency.

The memory interface 142 may serve as an interface for handling commands and data transferred between the controller 130 and the memory device 150, in order to allow the controller 130 to control the memory device 150 in response to a command or a request input from the host 102. In a case when the memory device 150 includes a NAND flash memory, the memory interface 142 includes a NAND flash controller (NFC). According to an embodiment, the memory interface 142 can be implemented through, or driven by, firmware called a Flash Interface Layer (FIL) for exchanging data with the memory device 150. Further, according to an embodiment, the memory interface 142 may support an open NAND flash interface (ONFi), a toggle mode, or the like, for data input/output with the memory device 150. For example, the ONFi may use a data path (e.g., a channel, a way, etc.) that includes at least one signal line capable of supporting bi-directional transmission and reception in a unit of 8-bit or 16-bit data. Data communication between the controller 130 and the memory device 150 can be achieved through at least one interface regarding an asynchronous single data rate (SDR), a synchronous double data rate (DDR), a toggle double data rate (DDR), or the like.

The memory 144 may be used as a working memory of the memory system 110 or the controller 130, while temporarily storing transactional data for operations performed in the memory system 110 and the controller 130. According to an embodiment, the memory 144 may be implemented with a volatile memory. For example, the memory 144 may be implemented with a static random access memory (SRAM), a dynamic random access memory (DRAM), or both. The memory 144 can be disposed within the controller 130, embodiments are not limited thereto. The memory 144 may be located within or external to the controller 130. For instance, the memory 144 may be embodied by an external volatile memory having a memory interface transferring data and/or signals between the memory 144 and the controller 130.

The processor 134 may control the overall operations of the memory system 110. For example, the processor 134 can control a program operation or a read operation of the memory device 150 in response to a write request or a read request entered from the host 102. According to an embodiment, the processor 134 may execute firmware to control the program operation or the read operation in the memory system 110. Herein, the firmware may be referred to as a flash translation layer (FTL). An example of the FTL will be described in detail, referring to FIGS. 3 and 4. According to an embodiment, the processor 134 may be implemented with a microprocessor, a central processing unit (CPU), or the like. According to an embodiment, the memory system 110 may be implemented with at least one multi-core processor, co-processors, or the like.

The plurality of memory blocks 152, 154, 156 included in the memory device 150 may be classified according to the number of bits that can be stored in, or expressed by, each memory cell. A memory block included in the memory device 150 may include a single level cell (SLC) memory block, a double level cell (DLC), a triple level cell (TLC), and a quadruple level cell (QLC), or a multiple level cell including a plurality of pages implemented by memory cells, each capable of storing 5 bits or more bits of data in one memory cell.

According to an embodiment, the controller 130 may use an MLC memory block included in the memory device 150 as an SLC memory block that stores one-bit data in each memory cell. A data input/output speed of the multi-level cell (MLC) memory block can be slower than that of the SLC memory block. That is, when the MLC memory block is used as the SLC memory block, a margin for a read or program operation can be reduced. For example, the controller 130 may perform a data input/output operation with a higher speed when the MLC memory block is used as the SLC memory block. The controller 130 may use the MLC memory block as a SLC buffer to temporarily store data because the SLC buffer for write data, or a write booster buffer, can provide a high data input/output speed for improving performance of the memory system 110.

According to an embodiment, the controller 130 can program data in a MLC a plurality of times without performing an erase operation on a specific MLC memory block included in the memory device 150. In general, non-volatile memory cells do not support data overwrite. However, the controller 130 may program 1-bit data in the MLC a plurality of times using a feature in which the MLC is capable of storing multi-bit data. For a MLC overwrite operation, the controller 130 may store the number of program times as separate operation information when 1-bit data is programmed in a MLC. According to an embodiment, an operation for uniformly levelling threshold voltages of the MLCs may be carried out before another 1-bit data is programmed in the same MLCs, each having stored 1-bit data.

According to an embodiment, the memory device 150 is embodied as a non-volatile memory such as a flash memory, for example, a Read Only Memory (ROM), a Mask ROM (MROM), a Programmable ROM (PROM), an Erasable ROM (EPROM), an Electrically Erasable ROM (EEPROM), a Magnetic (MRAM), a NAND flash memory, a NOR flash memory, or the like. In another embodiment, the memory device 150 may be implemented by at least one of a phase change random access memory (PCRAM), a Resistive Random Access Memory (ReRAM), a ferroelectrics random access memory (FRAM), a spin transfer torque random access memory (STT-RAM), and a spin transfer torque magnetic random access memory (STT-MRAM), or the like.

Figure 7:
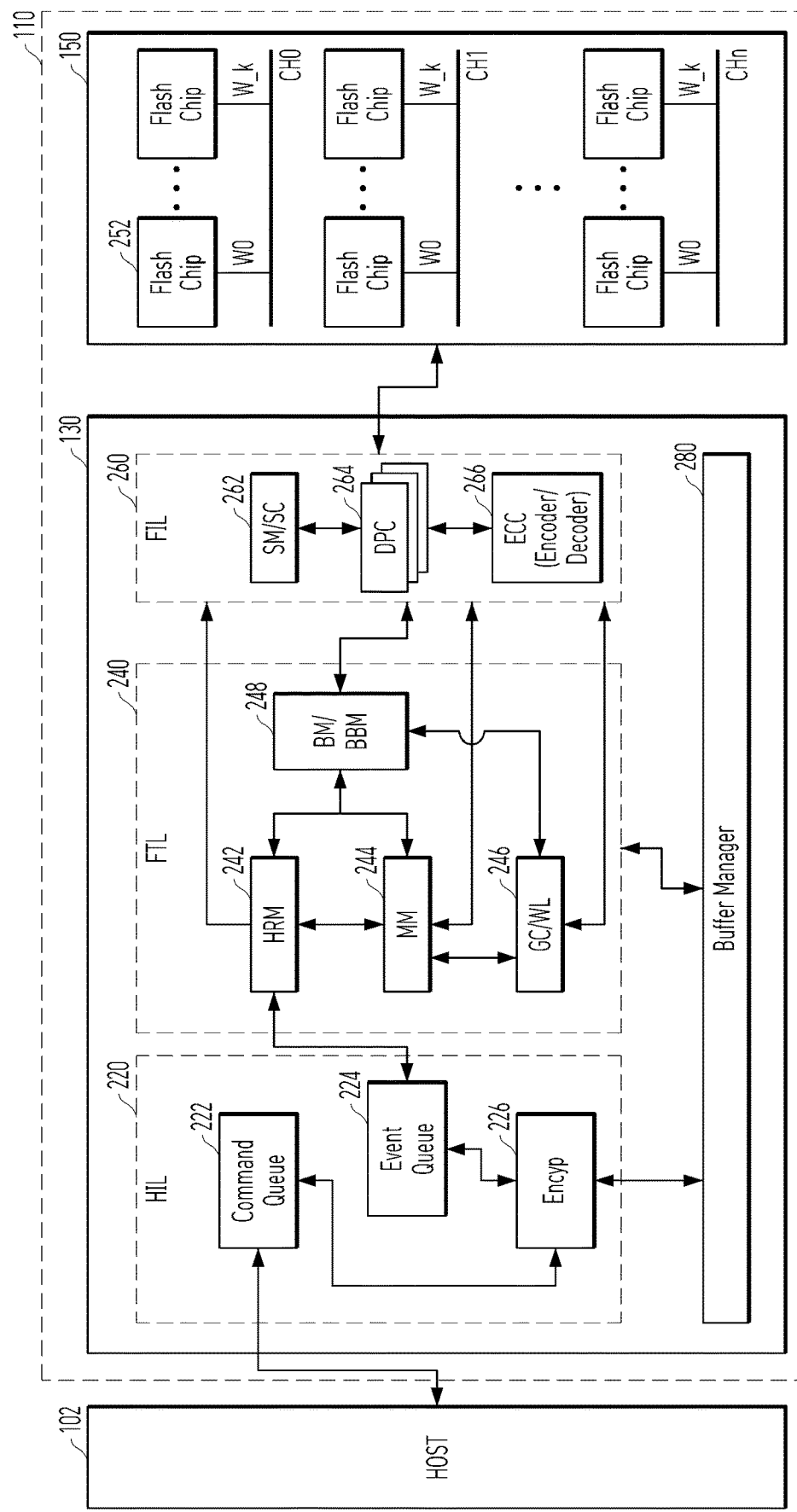
FIG. 7 illustrates a memory system according to an embodiment of the present disclosure.

FIG. 7 describes a memory system 110 according to an embodiment of the present disclosure.

Referring to FIG. 7, the controller 130 in the memory system 110 operates along with the host 102 and the memory device 150. As illustrated, the controller 130 may have a layered structure including a host interface layer (HIL) 220, a flash translation layer (FTL) 240, and a memory interface 260 including a flash interface layer (FIL).

The memory device 150 can include plural memory chips 252 coupled to the controller 130 through plural channels CH0, CH1, . . . , CH1_n and ways W0, . . . , W_k. The memory chip 252 can include a plurality of memory planes or a plurality of memory dies. According to an embodiment, each memory plane may be considered a logical or a physical partition including at least one memory block, a driving circuit capable of controlling an array including a plurality of non-volatile memory cells, and a buffer that can temporarily store data inputted to, or outputted from, non-volatile memory cells. Each memory plane or each memory die can support an interleaving mode in which plural data input/output operations are performed in parallel or simultaneously. According to an embodiment, memory blocks included in each memory plane, or each memory die, included in the memory device 150 can be grouped to input/output plural data entries as a super memory block. An internal configuration of the memory device 150 shown in the FIG. 7 may be changed based on operating performance of the memory system 110. An embodiment of the present disclosure may not be limited to the internal configuration described in the FIG. 7.

In an embodiment, the host interface layer 220, the flash translation layer 240, and the flash interface layer 260 are illustrated in the FIG. 7. The host interface layer 220, the flash translation layer 240, and the flash interface layer 260 may be implemented in various forms according to the operating performance of the memory system 110. According to an embodiment, the host interface layer 220 may be included in the host interface 132 in the FIG. 6, and the flash interface layer 260 may be included in the memory interface 142 in the FIG. 6.

A buffer manager 280 in the controller 130 can control the input/output of data or operation information in conjunction with the host interface layer 220, the flash translation layer 240, and the flash interface layer 260. To this end, the buffer manager 280 can set or establish various buffers, caches, or queues in the memory 144 in FIG. 6, and control data input/output of the buffers, the caches, or the queues, or data transmission between the buffers, the caches, or the queues in response to a request or a command generated by the host interface layer 220, the flash translation layer 240, and the flash interface layer 260. For example, the controller 130 may temporarily store read data provided from the memory device 150 in response to a request from the host 102 before providing the read data to the host 102. Also, the controller 130 may temporarily store write data provided from the host 102 in the memory 144 before storing the write data in the memory device 150. When controlling operations such as a read operation, a program operation, and an erase operation performed within the memory device 150, the read data or the write data transmitted or generated between the controller 130 and the memory device 150 in the memory system 110 could be stored and managed in a buffer, a queue, etc. established in the memory 144 by the buffer manager 280. Besides the read data or the write data, the buffer manager 280 can store signal or information (e.g., map data, a read command, a program command, or etc. which is used for performing operations such as programming and reading data between the host 102 and the memory device 150) in the buffer, the cache, the queue, etc. established in the memory 144. The buffer manager 280 can set, or manage, a command queue, a program memory, a data memory, a write buffer/cache, a read buffer/cache, a data buffer/cache, a map buffer/cache, and etc.

The host interface layer 220 may handle commands, data, and the like received from the host 102. By way of example but not limitation, the host interface layer 220 may include a command queue manager 222 and an event queue manager 224. The command queue manager 222 may sequentially store the commands, the data, and the like received from the host 102 in a command queue, and output them to the event queue manager 224, for example, in an order in which they are stored in the command queue manager 222. The event queue manager 224 may sequentially transmit events for processing the commands, the data, and the like received from the command queue. According to an embodiment, the event queue manager 224 may classify, manage, or adjust the commands, the data, and the like received from the command queue. Further, according to an embodiment, the host interface layer 220 can include an encryption manager 226 configured to encrypt a response or output data to be transmitted to the host 102 or to decrypt an encrypted portion in the command or data received from the host 102.

A plurality of commands or data of the same characteristic may be received from the host 102. Alternatively, a plurality of commands and data of different characteristics may be transmitted to the memory system 110 after being mixed or jumbled by the host 102. For example, a plurality of commands for reading data, i.e., read commands, may be delivered, or commands for reading data, i.e., a read command, and a command for programming/writing data, i.e., a write command, may be alternately transmitted to the memory system 110. The command queue manager 222 of the host interface layer 220 may sequentially store commands, data, and the like, which are received from the host 102, in the command queue. Thereafter, the host interface layer 220 may estimate or predict what type of internal operations the controller 130 will perform according to the characteristics of the commands, the data, and the like, which have been received from the host 102. The host interface layer 220 may determine a processing order and a priority of commands, data and the like based on their characteristics. According to the characteristics of the commands, the data, and the like received from the host 102, the event queue manager 224 in the host interface layer 220 is configured to receive an event, which should be processed or handled internally within the memory system 110 or the controller 130 according to the commands, the data, and the like input from the host 102, from the buffer manager 280. Then, the event queue manager 224 can transfer the event including the commands, the data, and the like into the flash translation layer (FTL) 240.

According to an embodiment, the flash translation layer (FTL) 240 may include a host request manager (HRM) 242, a map manager (MM) 244, a state manager 246, and a block manager (BM) 248. According to an embodiment, the flash translation layer (FTL) 240 may implement a multi-thread scheme to perform data input/output (I/O) operations. The FTL for the multi-thread scheme may be implemented through a multi-core processor using multi-thread included in the controller 130. For example, the host request manager (HRM) 242 may manage the events transmitted from the event queue. The map manager (MM) 244 may handle or control map data. The state manager 246 may perform an operation such as garbage collection (GC) or wear leveling (WL), after checking an operation state of the memory device 150. The block manager 248 may execute commands or instructions onto a block in the memory device 150.

The host request manager (HRM) 242 may use the map manager (MM) 244 and the block manager 248 to handle or process requests according to read and program commands and events which are delivered from the host interface layer 220. The host request manager (HRM) 242 may send an inquiry request to the map manager (MM) 244 to determine a physical address corresponding to a logical address which is entered with the events. The host request manager (HRM) 242 may send a read request with the physical address to the flash interface layer 260 to process the read request, i.e., handle the events. In an embodiment, the host request manager (HRM) 242 may send a program request (or a write request) to the block manager 248 to program data to a specific empty page without data stored in the memory device 150, and then may transmit a map update request corresponding to the program request to the map manager (MM) 244 in order to update an item relevant to the programmed data in mapping information between the logical addresses and physical addresses.

The block manager 248 may convert a program request delivered from the host request manager (HRM) 242, the map manager (MM) 244, and/or the state manager 246 into a flash program request used for the memory device 150, in order to manage flash blocks in the memory device 150. In order to maximize or enhance program or write performance of the memory system 110, the block manager 248 may collect program requests and send flash program requests for multiple-plane and one-shot program operations to the flash interface layer 260. In an embodiment, the block manager 248 sends several flash program requests to the flash interface layer 260 to enhance or maximize parallel processing of a multi-channel and multi-directional flash controller.

In an embodiment, the block manager 248 may manage blocks in the memory device 150 according to the number of valid pages, select and erase blocks having no valid pages when a free block is needed, and select a block including the least number of valid pages when it is determined that garbage collection is to be performed. The state manager 246 may perform garbage collection to move valid data stored in the selected block to an empty block and erase data stored in the selected block so that the memory device 150 may have enough free blocks (i.e., empty blocks with no data).

When the block manager 248 provides information regarding a block to be erased to the state manager 246, the state manager 246 may check all flash pages of the block to be erased to determine whether each page of the block is valid. For example, in order to determine validity of each page, the state manager 246 may identify a logical address recorded in an out-of-band (OOB) area of each page. To determine whether each page is valid, the state manager 246 may compare a physical address of the page with a physical address mapped to a logical address obtained from an inquiry request. The state manager 246 sends a program request to the block manager 248 for each valid page. A map table may be updated by the map manager 244 when a program operation is complete.

The map manager 244 may manage map data, e.g., a logical-physical map table. The map manager 244 may process various requests, for example, queries, updates, and the like, which are generated by the host request manager (HRM) 242 or the state manager 246. The map manager 244 may store the entire map table in the memory device 150, e.g., a flash/non-volatile memory, and cache mapping entries according to the storage capacity of the memory 144. When a map cache miss occurs while processing inquiry or update requests, the map manager 244 may send a read request to the flash interface layer 260 to load a relevant map table stored in the memory device 150. When the number of dirty cache blocks in the map manager 244 exceeds a certain threshold value, a program request may be sent to the block manager 246, so that a clean cache block is made and a dirty map table may be stored in the memory device 150.

When garbage collection is performed, the state manager 246 copies valid page(s) into a free block, and the host request manager (HRM) 242 may program the latest version of the data for the same logical address of the page and concurrently issue an update request. When the state manager 246 requests the map update in a state in which the copying of the valid page(s) is not completed normally, the map manager 244 may not perform the map table update. This is because the map request is issued with old physical information when the state manger 246 requests a map update and a valid page copy is completed later. The map manager 244 may perform a map update operation to ensure accuracy when, or only if, the latest map table still points to the old physical address.

The flash interface layer 260 may exchange data, commands, state information, and the like, with a plurality of memory chips 252 in the memory device 150 through a data communication method. According to an embodiment, the flash interface layer 260 may include a status check schedule manager (SM/SC) 262 and a data path manager or controller (DPC) 264. The status check schedule manager 262 can check and determine the operation state regarding the plurality of memory chips 252 coupled to the controller 130, the operation state regarding a plurality of channels CH0, CH1, . . . , CH1_n and the plurality of ways W0, . . . , W_k, and the like. The transmission and reception of data or commands can be scheduled in response to the operation states regarding the plurality of memory chips 252 and the plurality of channels CH0, CH1, . . . , CH1_n. The data path manager 264 can control the transmission and reception of data, commands, etc. through the plurality of channels CH0, CH1, . . . , CH1_n and ways W0, . . . , W_k based on the information transmitted from the status check schedule manager 262. According to an embodiment, the data path manager 264 may include a plurality of transceivers, each transceiver corresponding to each of the plurality of channels CH0, CH1, . . . , CH1_n. According to an embodiment, the status check schedule manager 262 and the data path manager 264 included in the flash interface layer 260 could be implemented as, or engaged with, the memory control sequence generator 332.

According to an embodiment, the flash interface layer 260 may further include ECC (error correction code) circuitry 266 configured to perform error checking and correction of data transferred between the controller 130 and the memory device 150. The ECC circuitry 266 may be implemented as a separate module, circuit, or firmware in the controller 130, but may also be implemented in each memory chip 252 included in the memory device 150 according to an embodiment. The ECC circuitry 266 may include a program, a circuit, a module, a system, or an apparatus for detecting and correcting an error bit of data processed by the memory device 150.

For finding and correcting any error of data transferred from the memory device 150, the ECC circuitry 266 can include an error correction code (ECC) encoder and an ECC decoder. The ECC encoder may perform error correction encoding of data to be programmed in the memory device 150 to generate encoded data into which a parity bit is added, and store the encoded data in the memory device 150. The ECC decoder can detect and correct error bits contained in the data read from the memory device 150 when the controller 130 reads the data stored in the memory device 150. For example, after performing error correction decoding on the data read from the memory device 150, the ECC circuitry 266 can determine whether the error correction decoding has succeeded or not, and output an instruction signal, e.g., a correction success signal or a correction fail signal, based on a result of the error correction decoding. The ECC circuitry 266 may use a parity bit, which has been generated during the ECC encoding process for the data stored in the memory device 150, in order to correct the error bits of the read data entries. When the number of the error bits is greater than or equal to the number of correctable error bits, the ECC circuitry 266 may not correct the error bits and instead may output the correction fail signal indicating failure in correcting the error bits.

According to an embodiment, the ECC circuitry 266 of FIG. 7 or the error correction circuitry 138 of FIG. 6 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), or the like. The ECC circuitry 266 or the error correction circuitry 138 may include all circuits, modules, systems, and/or devices for performing the error correction operation based on at least one of the above-described codes.

In accordance with an embodiment, each manager included in the host interface layer 220, the flash translation layer (FTL) 240, and the flash interface layer 260 could be implemented with a general processor, an accelerator, a dedicated processor, a co-processor, a multi-core processor, or the like. According to an embodiment, the manager can be implemented with firmware working with a processor.

Figure 8:
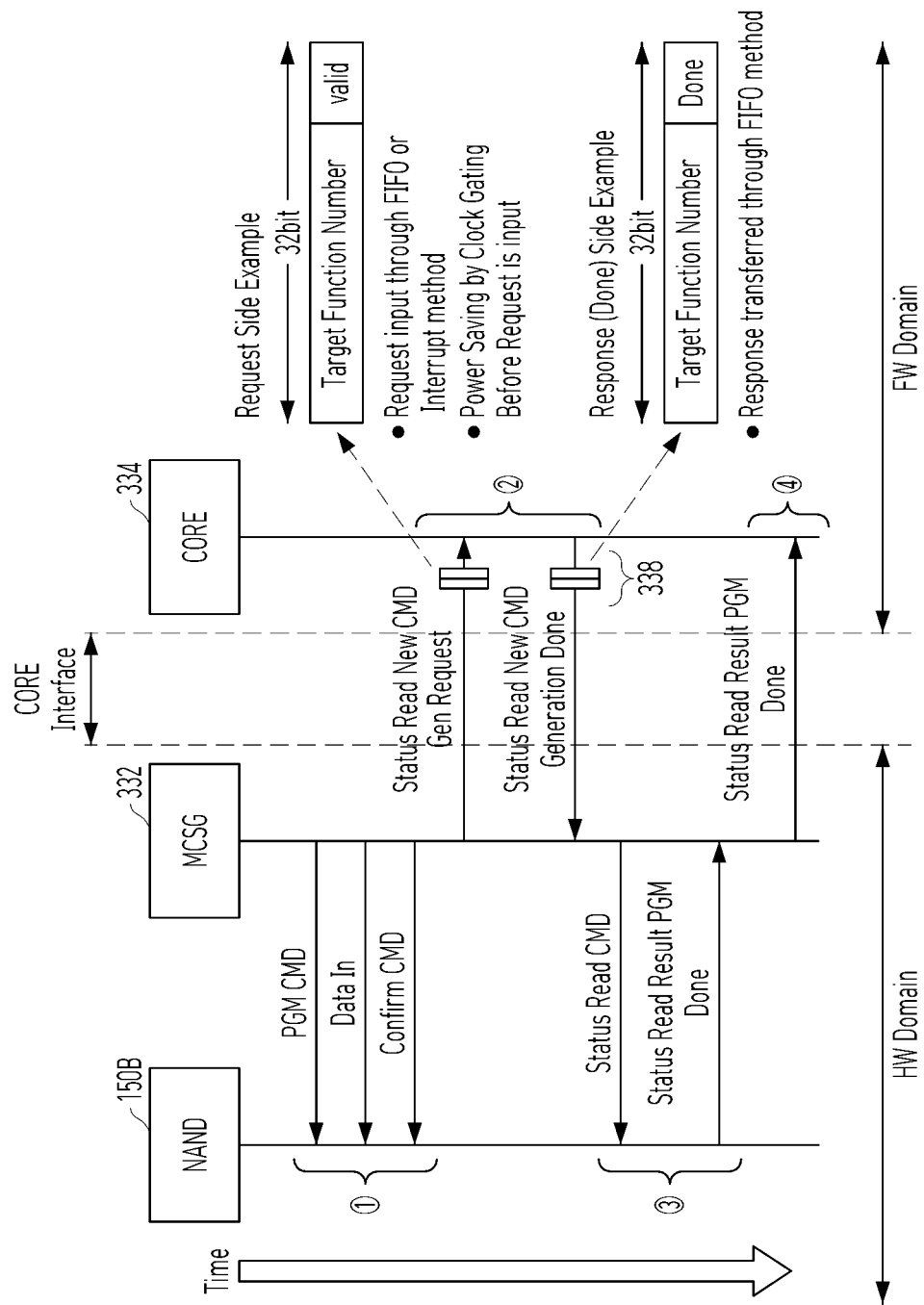
FIG. 8 illustrates a program operation according to an embodiment of the present disclosure.

FIG. 8 illustrates a program operation according to an embodiment of the present disclosure. In an embodiment, the program operation can include an operation of programming, in the second memory device 150B, write data received from the host 102 in FIGS. 6 and 7. According to an embodiment, the program operation may include an operation for programming data or moving data through an internal operation (or a background operation) such as garbage collection, wear leveling, and read reclaim performed by the controller 130 in FIGS. 6 and 7. In FIG. 8, in relation to the program operation, an operation or a procedure after a request for programming data in the second memory device 150B is passed to the memory control sequence generator (MCSG) 332 through an operation or a procedure performed by the host interface layer (HIL) 220 or the flash translation layer (FTL) 240 will be described. In addition, the memory control sequence generator 332 is designed to perform a command sequence corresponding to the first information regarding the internal configuration or operational characteristics of the first memory device 150A in FIG. 1. Further, the controller 130 can recognize that the first memory device 150A does not have an internal component (e.g., a verification mechanism, a status register, etc.) which may be used to check status information regarding the performed operation based on the first information. However, the controller 130 can recognize that the second memory device 150B has the internal component (e.g., a verification mechanism, status information on the performed operation) based on the second information.

Referring to FIG. 8, in response to a request for programming data in the second memory device 150B, the memory control sequence generator 332 may transmit a program command (PGM CMD) to the second memory device (e.g., NAND) 150B. After transferring the program command (PGM CMD) to the second memory device 150B, the memory control sequence generator 332 may transfer write data to the second memory device 150B (Data In). Then, the memory control sequence generator 332 may check whether the program command has been successfully transmitted to the second memory device 150B (Confirm CMD). In response to the program command PGM CMD, the second memory device 150B may program data transferred from the memory control sequence generator 332. In a first procedure ① above described, there might be no difference between the first memory device 150A and the second memory device 150B. However, a difference between the first memory device 150A and the second memory device 150B may occur during a procedure for checking an execution result after the program operation responsive to the program command PGM CMD is performed in the first memory device 150A and the second memory device 150B.

Because the second memory device 150B includes components (e.g., a verification mechanism, a status register, etc.) which are capable of providing status information regarding operations performed therein, the controller 130 may generate a command corresponding to the components. However, the memory control sequence generator 332 belonging to the hardware fixed domain (HW Fixed Domain) could not generate a command for the corresponding components. Accordingly, the memory control sequence generator 332 may hand over authority for generating the command to the core-processor 334. When the memory control sequence generator 332 enters the handover state 470, the core interface may transmit a request for generating a command for reading state information to the core-processor 334 (Status Read New CMD Generation Request). For example, a request transmitted to the core-processor 334 through the core interface may have a length of 32 bits including a specific function number and an indicator used to check validity of the request.

In response to the request input through the core interface, the core-processor 334 may generate a command and transmit the command to the memory control sequence generator 332. The memory control sequence generator 332 may transmit the command to the second memory device 150B. For example, a response of the core-processor 334 may have a length of 32 bits including the command and an indicator showing that the response for the request (Status Read New CMD Generation Request) has been completed or done.

Referring to FIG. 8, at least one queue 338 in the core interface can store one or more requests input through the core interface or a response of the core-processor 334. Stored requests or responses might be sequentially transmitted to the memory control sequence generator 332 or the core-processor 334. The memory control sequence generator 332 or the core-processor 334 may sequentially receive and process the request or response stored in the at least one queue 338.

In an embodiment, the core-processor 334 may be working in a low-power environment and may maintain an inactive state through clock gating before a request is transmitted through a core interface. Clock gating is a technology that reduces power consumption by selectively disabling clock signals input to a specific circuit block that is not needed to work at specific times in a digital circuit, including a processor. Clock gating in the processor can be used to turn off the clock signal applied to a certain part of the processor when the part is not needed to work. For clock gating for the core-processor 334, the clock signal can be selectively deactivated when all or a part of the core-processor 334 is not in use. When the clock signal is inactive, an operation of the core-processor 334 could be stopped so that power consumption could be reduced. A clock gating circuit included in the core-processor 334 may be implemented using logic gates such as AND, OR, and NOT gates.

A second procedure ② above described is performed and done after the command sequencer 410 in the memory control sequence generator 332 enters the handover state 470 from the sequence track state 460 until the command sequencer 410 makes a transition to the sequence track state 460 again.

The memory control sequence generator 332 may transfer the command generated by the core-processor 334 to the second memory device 150B (Status Read CMD). The second memory device 150B may output, to the memory control sequence generator 332, state information indicating whether the program operation is successfully completed in response to the command. This third procedure ③ can be expected by the second memory device 150B. However, the memory control sequence generator 332 designed to correspond to the first memory device 150A could be engaged with the core-processor 334 to perform the third procedure ③.

Thereafter, because the memory control sequence generator 332 does not have a logic or circuitry to check the response (Status Read Result PGM Done) transmitted from the second memory device 150B, the response could be transmitted to the core-processor 334. The core-processor 334 with the firmware may parse the corresponding response to determine whether the program operation is successfully completed. A fourth procedure ④, like the second procedure ②, may be performed after the command sequencer 410 in the memory control sequence generator 332 enters the handover state 470 from the sequence track state 460 until the command sequencer 410 makes a transition to the sequence track state 460 again.

Through procedures, the memory controller 330 including the memory control sequence generator 332 and the core-processor 334 may check whether the program operation corresponding to the program request has been successfully completed in the second memory device 150B. It is possible for the memory controller 330 to effectively determine whether or not to perform a verification operation corresponding to the program operation or when to perform the verification operation.

Figure 9:
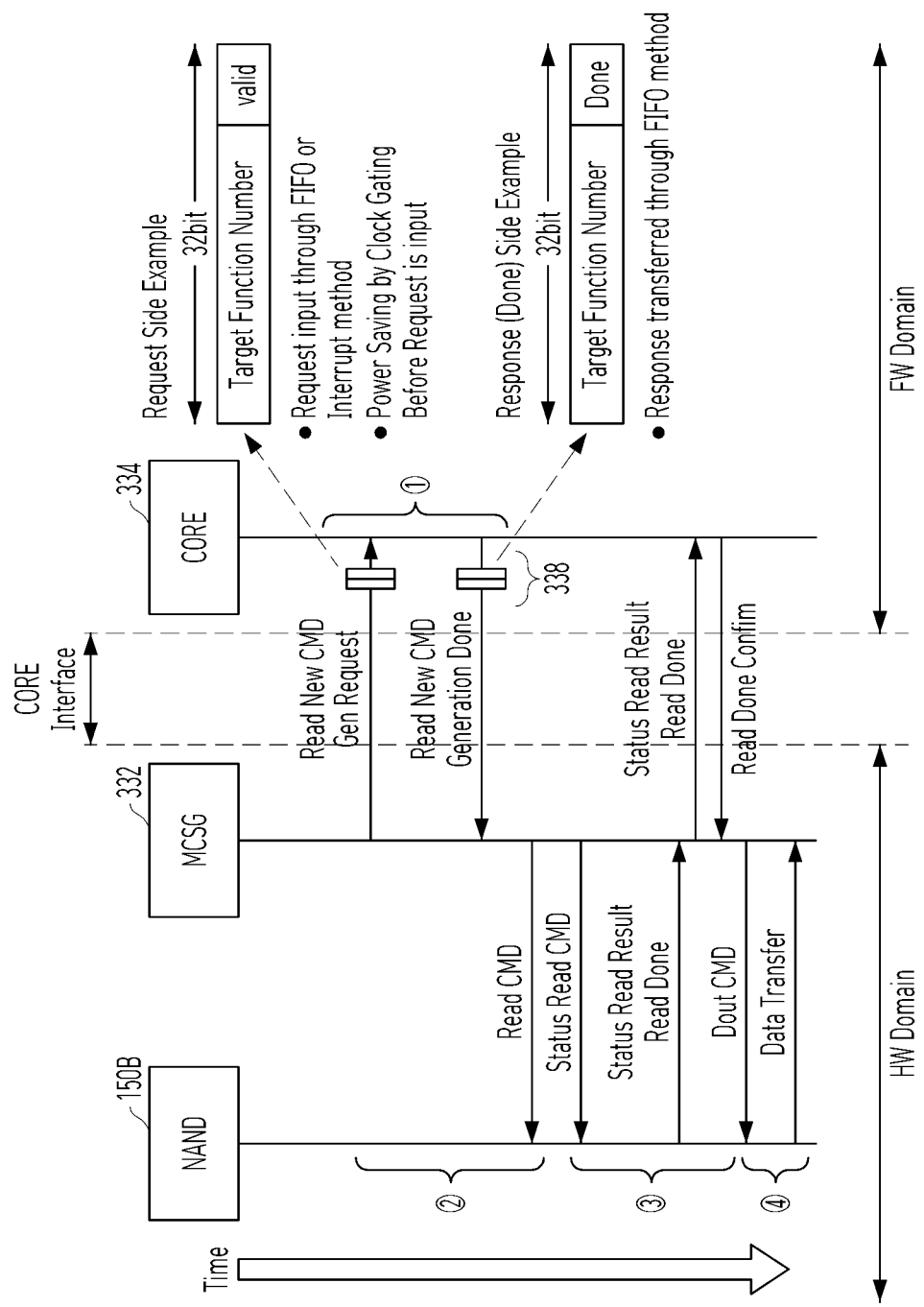
FIG. 9 illustrates a read operation according to an embodiment of the present disclosure.

FIG. 9 illustrates a read operation according to an embodiment of the present disclosure. In an embodiment, the read operation can include an operation of outputting read data stored in the second memory device 150 in response to a read command transmitted from the host 102 in FIGS. 6 and 7. According to an embodiment, the read operation may include an operation for reading data stored in the second memory device 150 for performing an internal operation (or a background operation) such as garbage collection, wear leveling, and read reclaim performed by the controller 130 in FIGS. 6 and 7. Specifically, FIG. 9 shows an operation or a procedure after a request for programming data in the second memory device 150B is passed to the memory control sequence generator 332 through an operation or a procedure performed by the host interface layer (HIL) 220 or the flash translation layer (FTL) 240, in relation to the read operation. In addition, the memory control sequence generator 332 is designed to perform a command sequence corresponding to the first information regarding the internal configuration or operational characteristics of the first memory device 150A in FIG. 1. Further, the controller 130 can recognize that the first memory device 150A does not have an internal component (e.g., a verification mechanism, a status register, etc.) which may be used to check status information regarding the performed operation based on the first information. However, the controller 130 can recognize that the second memory device 150B has the internal component (e.g., a verification mechanism, status information on the performed operation) based on the second information.

Referring to FIG. 9, a read request (Read CMD) for reading data stored in the second memory device 150B may be transmitted to the memory control sequence generator (MCSG) 332. Before transmitting the read request (Read CMD) to the second memory device 150B, the memory control sequence generator 332 may enter the handover state 470 so that the core-processor 334 generates a command for checking an operating state in the second memory device 150B. When the memory control sequence generator 332 enters the handover state 470, the core interface may transmit a request for generating the command for obtaining state information to the core-processor 334 (Status Read New CMD Generation Request). For example, the request transmitted to the core-processor 334 through the core interface may have a length of 32 bits including a specific function number and an indicator capable of checking validity of the request.

The program operation corresponding to the program command described in FIG. 8 has a longer operation margin than the read operation corresponding to the read command described in FIG. 9. Therefore, in a case of the program operation, even if a request for generating a command for obtaining state information of the second memory device 150B is transmitted to the core-processor 334 after the program command is transferred to the second memory device 150B, there may be sufficient time for the core-processor 334 to generate the command. However, because the read operation performed in FIG. 9 is different from the program operation, the memory control sequence generator 332 can transfer to the core-processor 334 a request of generating a command to obtain state information of the second memory device 150B before transmitting the read request (Read CMD) to the second memory device 150B. A data communication method between the memory control sequence generator 332 and the core-processor 334 through the core interface may be performed through the queue 338 as described in FIG. 8. A first procedure ① above described can be performed after the command sequencer 410 in the memory control sequence generator 332 enters the handover state 470 from the sequence track state 460 until the command sequencer 410 makes a transition to the sequence track state 460 from the handover state 470.

The memory control sequence generator 332 may transfer the read request (Read CMD) to the second memory device 150B. In a second procedure ②, there might be no difference between the first memory device 150A and the second memory device 150B.

Thereafter, the memory control sequence generator 332 may transfer the command generated by the core-processor 334 to the second memory device 150B (Status Read CMD). The second memory device 150B may output, to the memory control sequence generator 332, status information indicating whether the read operation has been successfully completed in response to the read request. Because the memory control sequence generator 332 does not have a logic or circuitry to check or recognize the response (Status Read Result Read Done) transferred from the second memory device 150B, the response can be transmitted to the core-processor 334. The core-processor 334 may parse the response to determine whether the read operation is successfully completed. This third procedure ③ could be expected from the side of the second memory device 150B. However, the memory control sequence generator 332 designed for the first memory device 150A should be engaged with the core-processor 334 to check the status information of the second memory device 150B. Like the second procedure ②, the third procedure ③ could be carried out after the command sequencer 410 in the memory control sequence generator 332 enters the handover state 470 from the sequence track state 460 until the command sequencer 410 makes a transition to the sequence track state 460 from the handover state 470.

The memory controller 330 including the memory control sequence generator 332 and the core-processor 334 may determine whether the read operation corresponding to the read request has been successfully completed in the second memory device 150B. Then, the memory control sequence generator 332 may transmit a data output request (Dout CMD) for outputting read data corresponding to the read operation to the second memory device 150B. The second memory device 150B may output the read data (Data Transfer) to the memory controller 330 in response to the data output request (Dout CMD). In this fourth procedure ④, there may be no difference between the first memory device 150A and the second memory device 150B. However, the memory control sequence generator 332 can recognize that the read operation has been completed in the second memory device 150B, so that the memory controller 330 can more efficiently determine a timing of transmitting the data output request (Dout CMD) to the second memory device 150B.

In FIGS. 8 and 9, it has been described that the core-processor 344 parses a response to a command generated by the core-processor 344 for obtaining state information from the second memory device 150B. According to an embodiment, when the core-processor 344 generates a command capable of obtaining state information of the second memory device 150B and transmits the command to the memory control sequence generator 332, the core-processor 344 may also deliver information capable of analyzing or parsing the response into the memory control sequence generator 332.

In this case, the memory control sequence generator 332 might not have to enter the handover state 470 for analyzing or parsing the response regarding the state information transmitted from the second memory device 150B. The memory control sequence generator 332 can check the response in the sequence track state 460. Then, the memory control sequence generator 332 can determine an operating state by itself and proceed to a next step of the operation sequence.

Figure 10:
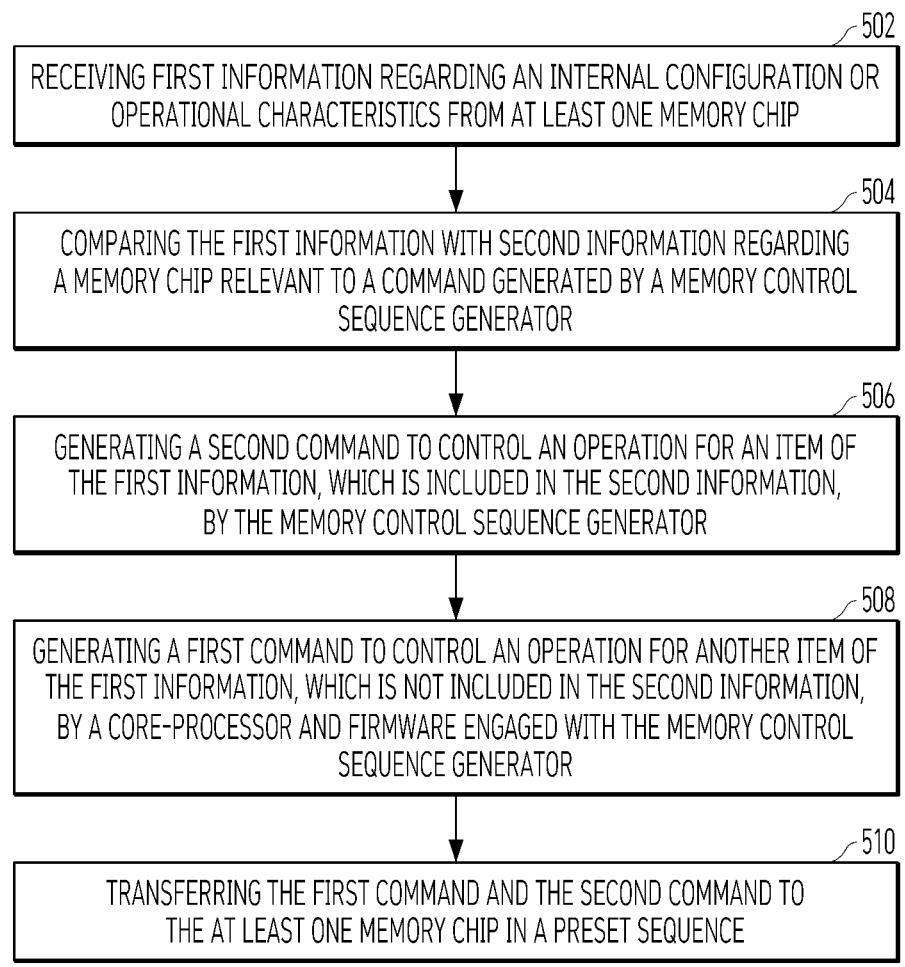
FIG. 10 illustrates an operation method of a memory system according to an embodiment of the present disclosure.

FIG. 10 is a flow chart illustrating an operation method of a memory system according to an embodiment of the present disclosure.

Referring to FIG. 10, a method for operating a memory system includes receiving first information about an internal configuration or operating characteristics from at least one memory chip (operation 502) and comparing the first information with second information regarding a memory chip for which the memory control sequence generator is designed to generate at least one command. The memory system can check information regarding the internal configuration or operating characteristics of at least one memory chip coupled to the memory controller, determine whether the core-processor 334 in FIGS. 1, 3, 8, and 9 is used, and determine whether the memory control sequence generator 332 makes a transition to the handover state 470.

When it is determined that a data input/output operation for at least one memory chip is performed, the method for operating the memory system can include generating a second command to control an operation associated with some information items of first information, which are included in second information, through the memory control sequence generator 322 (operation 506) and generating a first command to control an operation associated with other information items of the first information, which are not included in the second information, through the core-processor 334 with the firmware 336 which interworks with the memory control sequence generator 322 (operation 508).

In an embodiment, the operating method of the memory system may include transferring the first command and the second command to at least one memory chip according to a preset sequence (operation 510). In an embodiment, the preset sequence may be determined based on a sequence of commands related to a data input/output operation performed by the memory control sequence generator 332. As described with reference to FIGS. 8 and 9, a timing at which the memory system requests generation of the first or second command may be changed according to a type or operation characteristics of the data input/output operation. A timing at which the first or second command is transferred to at least one memory chip may also be changed according to the type or the operation characteristics of the data input/output operation.

As above described, deterioration of data input/output performance may be reduced in a low-power memory device or memory system according to an embodiment of the present invention.

In addition, a memory device or memory system according to an embodiment of the present invention may provide a memory controller and a control device capable of performing a hardware-based high-speed data input/output operation on plural memory devices having different internal configurations and operational characteristics.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods or operations of the computer, processor, controller, or other signal processing device, are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, generators, logic, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, generators, logic, interfaces, decoders, drivers, generators and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods or operations of the computer, processor, microprocessor, controller, or other signal processing device, are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A memory system, comprising:
    at least one memory chip including first information regarding internal configurations and operational characteristics; and
    a memory controller configured to perform a data input/output operation on the at least one memory chip,
    wherein the memory controller comprises:
    a core-processor engaged with firmware configured to generate at least one first command for controlling an operation associated with the first information;
    a memory control sequence generator configured to generate at least one second command for controlling an operation performed on a memory chip which includes second information; and
    a core interface configured to, when the first information is included in the second information, handover, to the core-processor from the memory control sequence generator, a process for generating some of the at least one first command associated with a part of the first information, the part not included in the second information.

2. The memory system according to claim 1, wherein the at least one first command comprises a command for checking an operational state of the at least one memory chip.

3. The memory system according to claim 2, wherein, after the memory control sequence generator transfers a program command for a program operation performed on the at least one memory chip, the core interface requests generation of the some of the at least one first command to the core-processor.

4. The memory system according to claim 3, wherein the memory controller transfers the some of the at least one first command generated by the core-processor to the at least one memory chip through the memory control sequence generator.

5. The memory system according to claim 3, wherein, after the memory control sequence generator receives a response regarding the some of the at least one first command from the at least one memory chip, the core interface transfers the response to the core-processor, and the core-processor analyzes the response to check whether the program operation is successfully completed.

6. The memory system according to claim 2, wherein the memory control sequence generator sequentially transfers, to the at least one memory chip, a read command for a read operation performed on the at least one memory chip and the some of the at least one first command.

7. The memory system according to claim 6, wherein the core interface requests generation of the some of the at least one first command to the core-processor, before the memory control sequence generator transfers the read command to the at least one memory chip.

8. The memory system according to claim 7, wherein the memory control sequence generator is configured to, based on a response regarding the some of the at least one first command, transfer, to the at least one memory chip, a command for outputting read data subject to the read operation and receive the read data from the at least one memory chip.

9. The memory system according to claim 1, wherein the memory controller further comprises plural queues configured to be accessed by the core-processor and the core-interface.

10. The memory system according to claim 1, wherein the core-processor comprises a clock gating circuit configured to activate or deactivate a clock signal based on a request input from the core-interface.

11. A method for operating a memory system, comprising:
    receiving first information regarding an internal structure or operational characteristics from at least one memory chip;

comparing the first information with second information regarding a memory chip associated with a command generated by a memory control sequence generator;

generating a second command to control an operation associated with an item of the first information, which is included in the second information, by the memory control sequence generator;

generating a first command to control an operation associated with another item of the first information, which is not included in the second information, by a core-processor engaged with firmware, the core-processor working with the memory control sequence generator; and transferring the first command and the second command to the at least one memory chip in a preset sequence.

12. The method according to claim 11, wherein the first command comprises a command for checking an operational state of the at least one memory chip.

13. The method according to claim 12, wherein, for a program operation performed on the at least one memory chip, the first command is generated after a program command included in the second command is transferred to the at least one memory chip.

14. The method according to claim 13, further comprising:

receiving, from the at least one memory chip, a response subject to the first command;

transferring the response to the core-processor; and analyzing the response through the core-processor to determine whether the program operation is successfully completed.

15. The method according to claim 12, further comprising:

sequentially transferring, to the at least one memory chip, a read command for a read operation performed on the at least one memory chip and the first command to perform the read operation performed on the at least one memory chip.

16. The method according to claim 15, further comprising:

requesting generation of the first command before transferring the read command to the at least one memory chip.

17. The method according to claim 16, further comprising:

receiving, from at least one memory chip, a response regarding the first command;

transferring, to the at least one memory chip, based on the response, a command for outputting read data subject to the read operation; and receiving the read data from the at least one memory chip.

18. The method according to claim 11, further comprising:

activating a clock signal input to the core-processor engaged with the memory control sequence controller, before generating the first command.

19. A memory controller, comprising:

a core-processor engaged with firmware configured to generate at least one first command for controlling an operation associated with the first information regarding internal configurations and operational characteristics of at least one memory chip;

a memory control sequence generator configured to generate at least one second command for controlling an operation performed on a memory chip which includes second information; and a core interface configured to, when the first information is included in the second information, handover, to the core-processor from the memory control sequence generator, a process for generating some of the at least one first command associated with a part of the first information, the part not included in the second information.

20. The memory controller according to claim 19, wherein the first command comprises a command for checking an operational state of the at least one memory chip, and the second command comprises a program command, a read command, and/or an erase command.

* * * * *